(12) United States Patent
Kasorla et al.

(10) Patent No.: US 8,767,459 B1
(45) Date of Patent: Jul. 1, 2014

(54) DATA STORAGE IN ANALOG MEMORY CELLS ACROSS WORD LINES USING A NON-INTEGER NUMBER OF BITS PER CELL

(75) Inventors: Yoav Kasorla, Even Yehuda (IL); Naftali Sommer, Rishon Le-Zion (IL); Eyal Gurgi, Petah-Tikva (IL); Micha Anholt, Tel-Aviv (IL)

(73) Assignee: Apple Inc., Cupertino, CA (US)

( * ) Notice: Subject to any disclaimer, the term of this patent is extended or adjusted under 35 U.S.C. 154(b) by 174 days.

(21) Appl. No.: 13/192,501

(22) Filed: Jul. 28, 2011

Related U.S. Application Data

(60) Provisional application No. 61/369,667, filed on Jul. 31, 2010, provisional application No. 61/475,241, filed on Apr. 14, 2011.

(51) Int. Cl.
*G11C 16/06* (2006.01)
*G11C 16/08* (2006.01)
*G11C 16/10* (2006.01)
*G11C 16/12* (2006.01)

(52) U.S. Cl.
USPC ............ 365/185.03; 365/185.12; 365/185.24; 365/238.5; 365/184; 365/185.18; 365/185.23; 711/108

(58) Field of Classification Search
USPC ............... 365/185.03, 185.12, 185.24, 238.5, 365/184, 185.18, 185.23; 711/108
See application file for complete search history.

(56) References Cited

U.S. PATENT DOCUMENTS

| | | | |
|---|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |

(Continued)

FOREIGN PATENT DOCUMENTS

| | | |
|---|---|---|
| EP | 0783754 B1 | 7/1997 |
| EP | 1434236 B1 | 6/2004 |

(Continued)

OTHER PUBLICATIONS

U.S. Appl. No. 12/323,544 Official Action dated Mar. 9, 2012.

(Continued)

*Primary Examiner* — J. H. Hur
(74) *Attorney, Agent, or Firm* — Meyertons, Hood, Kivlin, Kowert & Goetzel, P.C.

(57) ABSTRACT

A method for data storage includes accepting data for storage in an array of analog memory cells, which are arranged in rows associated with respective word lines. At least a first page of the data is stored in a first row of the array, and at least a second page of the data is stored in a second row of the array, having a different word line from the first row. After storing the first and second pages, a third page of the data is stored jointly in the first and second rows.

16 Claims, 8 Drawing Sheets

(56) References Cited

U.S. PATENT DOCUMENTS

| | | |
|---|---|---|
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | Deroo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,530,058 B1 * | 3/2003 | Visconti .................. 714/773 |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |

(56) References Cited

U.S. PATENT DOCUMENTS

| | | | |
|---|---|---|---|
| 6,781,877 B2 | 8/2004 | Cernea et al. | |
| 6,804,805 B2 | 10/2004 | Rub | |
| 6,807,095 B2 | 10/2004 | Chen et al. | |
| 6,807,101 B2 | 10/2004 | Ooishi et al. | |
| 6,807,610 B2 * | 10/2004 | Frayer | 711/156 |
| 6,809,964 B2 | 10/2004 | Moschopoulos et al. | |
| 6,819,592 B2 | 11/2004 | Noguchi et al. | |
| 6,829,167 B2 | 12/2004 | Tu et al. | |
| 6,845,052 B1 | 1/2005 | Ho et al. | |
| 6,847,550 B2 * | 1/2005 | Park | 365/185.03 |
| 6,851,018 B2 | 2/2005 | Wyatt et al. | |
| 6,851,081 B2 | 2/2005 | Yamamoto | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,870,773 B2 | 3/2005 | Noguchi et al. | |
| 6,873,552 B2 | 3/2005 | Ishii et al. | |
| 6,879,520 B2 | 4/2005 | Hosono et al. | |
| 6,882,567 B1 | 4/2005 | Wong | |
| 6,894,926 B2 | 5/2005 | Guterman et al. | |
| 6,907,497 B2 | 6/2005 | Hosono et al. | |
| 6,925,009 B2 | 8/2005 | Noguchi et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,958,938 B2 | 10/2005 | Noguchi et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 6,999,344 B2 | 2/2006 | Hosono et al. | |
| 7,002,843 B2 | 2/2006 | Guterman et al. | |
| 7,006,379 B2 | 2/2006 | Noguchi et al. | |
| 7,012,835 B2 | 3/2006 | Gonzalez et al. | |
| 7,016,226 B2 * | 3/2006 | Shibata et al. | 365/185.03 |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,071,849 B2 | 7/2006 | Zhang | |
| 7,072,222 B2 | 7/2006 | Ishii et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,145,805 B2 | 12/2006 | Ishii et al. | |
| 7,151,692 B2 | 12/2006 | Wu | |
| 7,158,058 B1 | 1/2007 | Yu | |
| 7,170,781 B2 | 1/2007 | So et al. | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzalez et al. | |
| 7,177,199 B2 | 2/2007 | Chen et al. | |
| 7,177,200 B2 | 2/2007 | Ronen et al. | |
| 7,184,338 B2 | 2/2007 | Nagakawa et al. | |
| 7,187,195 B2 | 3/2007 | Kim | |
| 7,187,592 B2 | 3/2007 | Guterman et al. | |
| 7,190,614 B2 | 3/2007 | Wu | |
| 7,193,898 B2 | 3/2007 | Cernea | |
| 7,193,921 B2 | 3/2007 | Choi et al. | |
| 7,196,644 B1 | 3/2007 | Anderson et al. | |
| 7,196,928 B2 | 3/2007 | Chen | |
| 7,196,933 B2 | 3/2007 | Shibata | |
| 7,197,594 B2 | 3/2007 | Raz et al. | |
| 7,200,062 B2 | 4/2007 | Kinsely et al. | |
| 7,210,077 B2 | 4/2007 | Brandenberger et al. | |
| 7,221,589 B2 * | 5/2007 | Li | 365/185.17 |
| 7,221,592 B2 | 5/2007 | Nazarian | |
| 7,224,613 B2 | 5/2007 | Chen et al. | |
| 7,231,474 B1 | 6/2007 | Helms et al. | |
| 7,231,562 B2 | 6/2007 | Ohlhoff et al. | |
| 7,243,275 B2 | 7/2007 | Gongwer et al. | |
| 7,254,690 B2 | 8/2007 | Rao | |
| 7,254,763 B2 | 8/2007 | Aadsen et al. | |
| 7,257,027 B2 | 8/2007 | Park | |
| 7,259,987 B2 | 8/2007 | Chen et al. | |
| 7,266,026 B2 | 9/2007 | Gongwer et al. | |
| 7,266,069 B2 | 9/2007 | Chu | |
| 7,269,066 B2 | 9/2007 | Nguyen et al. | |
| 7,272,757 B2 | 9/2007 | Stocken | |
| 7,274,611 B2 | 9/2007 | Roohparvar | |
| 7,277,355 B2 | 10/2007 | Tanzawa | |
| 7,280,398 B1 | 10/2007 | Lee et al. | |
| 7,280,409 B2 | 10/2007 | Misumi et al. | |
| 7,280,415 B2 | 10/2007 | Hwang et al. | |
| 7,283,399 B2 | 10/2007 | Ishii et al. | |
| 7,289,344 B2 | 10/2007 | Chen | |
| 7,301,807 B2 | 11/2007 | Khalid et al. | |
| 7,301,817 B2 | 11/2007 | Li et al. | |
| 7,308,525 B2 | 12/2007 | Lasser et al. | |
| 7,310,255 B2 | 12/2007 | Chan | |
| 7,310,269 B2 | 12/2007 | Shibata | |
| 7,310,271 B2 | 12/2007 | Lee | |
| 7,310,272 B1 | 12/2007 | Mokhlesi et al. | |
| 7,310,347 B2 | 12/2007 | Lasser | |
| 7,312,727 B1 | 12/2007 | Feng et al. | |
| 7,321,509 B2 | 1/2008 | Chen et al. | |
| 7,328,384 B1 | 2/2008 | Kulkarni et al. | |
| 7,342,831 B2 | 3/2008 | Mokhlesi et al. | |
| 7,343,330 B1 | 3/2008 | Boesjes et al. | |
| 7,345,924 B2 | 3/2008 | Nguyen et al. | |
| 7,345,928 B2 | 3/2008 | Li | |
| 7,349,263 B2 | 3/2008 | Kim et al. | |
| 7,356,755 B2 | 4/2008 | Fackenthal | |
| 7,363,420 B2 | 4/2008 | Lin et al. | |
| 7,365,671 B1 | 4/2008 | Anderson | |
| 7,388,781 B2 | 6/2008 | Litsyn et al. | |
| 7,397,697 B2 | 7/2008 | So et al. | |
| 7,405,974 B2 | 7/2008 | Yaoi et al. | |
| 7,405,979 B2 | 7/2008 | Ishii et al. | |
| 7,408,804 B2 | 8/2008 | Hemink et al. | |
| 7,408,810 B2 | 8/2008 | Aritome et al. | |
| 7,409,473 B2 | 8/2008 | Conley et al. | |
| 7,409,623 B2 | 8/2008 | Baker et al. | |
| 7,420,847 B2 | 9/2008 | Li | |
| 7,433,231 B2 | 10/2008 | Aritome | |
| 7,433,697 B2 | 10/2008 | Karaoguz et al. | |
| 7,434,111 B2 | 10/2008 | Sugiura et al. | |
| 7,437,498 B2 | 10/2008 | Ronen | |
| 7,440,324 B2 | 10/2008 | Mokhlesi | |
| 7,440,331 B2 | 10/2008 | Hemink | |
| 7,441,067 B2 | 10/2008 | Gorobetz et al. | |
| 7,447,970 B2 | 11/2008 | Wu et al. | |
| 7,450,421 B2 | 11/2008 | Mokhlesi et al. | |
| 7,453,737 B2 | 11/2008 | Ha | |
| 7,457,163 B2 | 11/2008 | Hemink | |
| 7,457,897 B1 | 11/2008 | Lee et al. | |
| 7,460,410 B2 | 12/2008 | Nagai et al. | |
| 7,460,412 B2 | 12/2008 | Lee et al. | |
| 7,466,592 B2 | 12/2008 | Mitani et al. | |
| 7,468,907 B2 | 12/2008 | Kang et al. | |
| 7,468,911 B2 | 12/2008 | Lutze et al. | |
| 7,469,049 B1 | 12/2008 | Feng | |
| 7,471,581 B2 | 12/2008 | Tran et al. | |
| 7,483,319 B2 | 1/2009 | Brown | |
| 7,487,329 B2 | 2/2009 | Hepkin et al. | |
| 7,487,394 B2 | 2/2009 | Forhan et al. | |
| 7,492,641 B2 | 2/2009 | Hosono et al. | |
| 7,508,710 B2 | 3/2009 | Mokhlesi | |
| 7,508,732 B2 * | 3/2009 | Park et al. | 365/235 |
| 7,526,711 B2 | 4/2009 | Orio | |

(56) References Cited

U.S. PATENT DOCUMENTS

| | | | |
|---|---|---|---|
| 7,539,052 B2 * | 5/2009 | Aritome | 365/185.03 |
| 7,539,061 B2 | 5/2009 | Lee | |
| 7,539,062 B2 | 5/2009 | Doyle | |
| 7,551,480 B2 * | 6/2009 | Park et al. | 365/185.11 |
| 7,551,492 B2 | 6/2009 | Kim | |
| 7,558,109 B2 | 7/2009 | Brandman et al. | |
| 7,558,839 B1 | 7/2009 | McGovern | |
| 7,568,135 B2 | 7/2009 | Cornwell et al. | |
| 7,570,520 B2 | 8/2009 | Kamei et al. | |
| 7,574,555 B2 | 8/2009 | Porat et al. | |
| 7,590,002 B2 | 9/2009 | Mokhlesi et al. | |
| 7,593,259 B2 | 9/2009 | Kim | |
| 7,594,093 B1 | 9/2009 | Kancherla | |
| 7,596,707 B1 | 9/2009 | Vemula | |
| 7,609,787 B2 | 10/2009 | Jahan et al. | |
| 7,613,043 B2 | 11/2009 | Cornwell et al. | |
| 7,616,498 B2 | 11/2009 | Mokhlesi et al. | |
| 7,619,918 B2 | 11/2009 | Aritome | |
| 7,631,245 B2 | 12/2009 | Lasser | |
| 7,633,798 B2 | 12/2009 | Sarin et al. | |
| 7,633,802 B2 | 12/2009 | Mokhlesi | |
| 7,639,532 B2 | 12/2009 | Roohparvar et al. | |
| 7,644,347 B2 | 1/2010 | Alexander et al. | |
| 7,656,734 B2 | 2/2010 | Thorp et al. | |
| 7,660,158 B2 | 2/2010 | Aritome | |
| 7,660,183 B2 | 2/2010 | Ware et al. | |
| 7,661,000 B2 | 2/2010 | Ueda et al. | |
| 7,661,054 B2 | 2/2010 | Huffman et al. | |
| 7,665,007 B2 | 2/2010 | Yang et al. | |
| 7,668,012 B2 * | 2/2010 | Aritome | 365/185.03 |
| 7,680,987 B1 | 3/2010 | Clark et al. | |
| 7,701,765 B2 * | 4/2010 | Aritome | 365/185.03 |
| 7,733,712 B1 | 6/2010 | Walston et al. | |
| 7,742,351 B2 | 6/2010 | Inoue et al. | |
| 7,761,624 B2 | 7/2010 | Karamcheti et al. | |
| 7,797,609 B2 | 9/2010 | Neuman | |
| 7,810,017 B2 | 10/2010 | Radke | |
| 7,848,149 B2 | 12/2010 | Gonzalez et al. | |
| 7,869,273 B2 | 1/2011 | Lee et al. | |
| 7,885,119 B2 | 2/2011 | Li | |
| 7,904,783 B2 | 3/2011 | Brandman et al. | |
| 7,911,835 B2 * | 3/2011 | Kim et al. | 365/185.03 |
| 7,924,613 B1 | 4/2011 | Sommer | |
| 7,925,936 B1 | 4/2011 | Sommer | |
| 7,928,497 B2 | 4/2011 | Yaegashi | |
| 7,929,549 B1 | 4/2011 | Talbot | |
| 7,930,515 B2 | 4/2011 | Gupta et al. | |
| 7,945,825 B2 | 5/2011 | Cohen et al. | |
| 7,978,516 B2 | 7/2011 | Olbrich et al. | |
| 7,995,388 B1 | 8/2011 | Winter et al. | |
| 8,000,135 B1 | 8/2011 | Perlmutter et al. | |
| 8,000,141 B1 | 8/2011 | Shalvi et al. | |
| 8,014,094 B1 | 9/2011 | Jin | |
| 8,037,380 B2 | 10/2011 | Cagno et al. | |
| 8,040,744 B2 | 10/2011 | Gorobets et al. | |
| 8,065,583 B2 | 11/2011 | Radke | |
| 2001/0002172 A1 | 5/2001 | Tanaka et al. | |
| 2001/0006479 A1 | 7/2001 | Ikehashi et al. | |
| 2002/0038440 A1 | 3/2002 | Barkan | |
| 2002/0056064 A1 | 5/2002 | Kidorf et al. | |
| 2002/0118574 A1 | 8/2002 | Gongwer et al. | |
| 2002/0133684 A1 | 9/2002 | Anderson | |
| 2002/0166091 A1 | 11/2002 | Kidorf et al. | |
| 2002/0174295 A1 | 11/2002 | Ulrich et al. | |
| 2002/0196510 A1 | 12/2002 | Hietala et al. | |
| 2003/0002348 A1 | 1/2003 | Chen et al. | |
| 2003/0103400 A1 | 6/2003 | Van Tran | |
| 2003/0161183 A1 | 8/2003 | Tran | |
| 2003/0189856 A1 | 10/2003 | Cho et al. | |
| 2004/0057265 A1 | 3/2004 | Mirabel et al. | |
| 2004/0057285 A1 | 3/2004 | Cernea et al. | |
| 2004/0083333 A1 | 4/2004 | Chang et al. | |
| 2004/0083334 A1 | 4/2004 | Chang et al. | |
| 2004/0105311 A1 | 6/2004 | Cernea et al. | |
| 2004/0114437 A1 | 6/2004 | Li | |
| 2004/0160842 A1 | 8/2004 | Fukiage | |
| 2004/0223371 A1 | 11/2004 | Roohparvar | |
| 2005/0007802 A1 | 1/2005 | Gerpheide | |
| 2005/0013165 A1 | 1/2005 | Ban | |
| 2005/0024941 A1 | 2/2005 | Lasser et al. | |
| 2005/0024978 A1 | 2/2005 | Ronen | |
| 2005/0030788 A1 | 2/2005 | Parkinson et al. | |
| 2005/0086574 A1 | 4/2005 | Fackenthal | |
| 2005/0121436 A1 | 6/2005 | Kamitani et al. | |
| 2005/0144361 A1 | 6/2005 | Gonzalez et al. | |
| 2005/0157555 A1 | 7/2005 | Ono et al. | |
| 2005/0162913 A1 | 7/2005 | Chen | |
| 2005/0169051 A1 | 8/2005 | Khalid et al. | |
| 2005/0189649 A1 | 9/2005 | Maruyama et al. | |
| 2005/0213393 A1 | 9/2005 | Lasser | |
| 2005/0224853 A1 | 10/2005 | Ohkawa | |
| 2005/0240745 A1 | 10/2005 | Iyer et al. | |
| 2005/0243626 A1 | 11/2005 | Ronen | |
| 2006/0004952 A1 | 1/2006 | Lasser | |
| 2006/0028875 A1 | 2/2006 | Avraham et al. | |
| 2006/0028877 A1 | 2/2006 | Meir | |
| 2006/0101193 A1 | 5/2006 | Murin | |
| 2006/0106972 A1 | 5/2006 | Gorobets et al. | |
| 2006/0107136 A1 | 5/2006 | Gongwer et al. | |
| 2006/0129750 A1 | 6/2006 | Lee et al. | |
| 2006/0133141 A1 | 6/2006 | Gorobets | |
| 2006/0156189 A1 | 7/2006 | Tomlin | |
| 2006/0179334 A1 | 8/2006 | Brittain et al. | |
| 2006/0190699 A1 | 8/2006 | Lee | |
| 2006/0203546 A1 | 9/2006 | Lasser | |
| 2006/0209596 A1 * | 9/2006 | Li | 365/185.17 |
| 2006/0218359 A1 | 9/2006 | Sanders et al. | |
| 2006/0221692 A1 | 10/2006 | Chen | |
| 2006/0221705 A1 | 10/2006 | Hemink et al. | |
| 2006/0221714 A1 | 10/2006 | Li et al. | |
| 2006/0239077 A1 | 10/2006 | Park et al. | |
| 2006/0239081 A1 | 10/2006 | Roohparvar | |
| 2006/0256620 A1 | 11/2006 | Nguyen et al. | |
| 2006/0256626 A1 | 11/2006 | Werner et al. | |
| 2006/0256891 A1 | 11/2006 | Yuan et al. | |
| 2006/0271748 A1 | 11/2006 | Jain et al. | |
| 2006/0285392 A1 | 12/2006 | Incarnati et al. | |
| 2006/0285396 A1 | 12/2006 | Ha | |
| 2007/0006013 A1 | 1/2007 | Moshayedi et al. | |
| 2007/0019481 A1 | 1/2007 | Park | |
| 2007/0033581 A1 | 2/2007 | Tomlin et al. | |
| 2007/0047314 A1 | 3/2007 | Goda et al. | |
| 2007/0047326 A1 | 3/2007 | Nguyen et al. | |
| 2007/0050536 A1 | 3/2007 | Kolokowsky | |
| 2007/0058446 A1 | 3/2007 | Hwang et al. | |
| 2007/0061502 A1 | 3/2007 | Lasser et al. | |
| 2007/0067667 A1 | 3/2007 | Ikeuchi et al. | |
| 2007/0074093 A1 | 3/2007 | Lasser | |
| 2007/0086239 A1 | 4/2007 | Litsyn et al. | |
| 2007/0086260 A1 | 4/2007 | Sinclair | |
| 2007/0089034 A1 | 4/2007 | Litsyn et al. | |
| 2007/0091677 A1 | 4/2007 | Lasser et al. | |
| 2007/0091694 A1 | 4/2007 | Lee et al. | |
| 2007/0103978 A1 | 5/2007 | Conley et al. | |
| 2007/0103986 A1 | 5/2007 | Chen | |
| 2007/0104211 A1 | 5/2007 | Opsasnick | |
| 2007/0109845 A1 | 5/2007 | Chen | |
| 2007/0109849 A1 | 5/2007 | Chen | |
| 2007/0115726 A1 | 5/2007 | Cohen et al. | |
| 2007/0118713 A1 | 5/2007 | Guterman et al. | |
| 2007/0143378 A1 | 6/2007 | Gorobets | |
| 2007/0143531 A1 | 6/2007 | Atri | |
| 2007/0159889 A1 | 7/2007 | Kang et al. | |
| 2007/0159892 A1 | 7/2007 | Kang et al. | |
| 2007/0159907 A1 | 7/2007 | Kwak | |
| 2007/0168837 A1 | 7/2007 | Murin | |
| 2007/0171714 A1 | 7/2007 | Wu et al. | |
| 2007/0183210 A1 | 8/2007 | Choi et al. | |
| 2007/0189073 A1 | 8/2007 | Aritome | |
| 2007/0195602 A1 | 8/2007 | Fong et al. | |
| 2007/0206426 A1 | 9/2007 | Mokhlesi | |
| 2007/0208904 A1 | 9/2007 | Hsieh et al. | |
| 2007/0226599 A1 | 9/2007 | Motwani | |
| 2007/0236990 A1 | 10/2007 | Aritome | |

(56) References Cited

U.S. PATENT DOCUMENTS

| | | |
|---|---|---|
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0084740 A1 * | 4/2008 | Kim et al. ............... 365/185.03 |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann et al. |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0124088 A1 | 5/2010 | Shalvi et al. |
| 2010/0131697 A1 | 5/2010 | Alrod et al. |
| 2010/0131827 A1 | 5/2010 | Sokolov et al. |
| 2010/0142268 A1 | 6/2010 | Aritome |
| 2010/0142277 A1 | 6/2010 | Yang et al. |
| 2010/0157675 A1 | 6/2010 | Shalvi et al. |
| 2010/0165689 A1 | 7/2010 | Rotbard et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0195390 A1 | 8/2010 | Shalvi |
| 2010/0199150 A1 | 8/2010 | Shalvi et al. |
| 2010/0211803 A1 | 8/2010 | Lablans |
| 2010/0220509 A1 | 9/2010 | Sokolov et al. |
| 2010/0220510 A1 | 9/2010 | Shalvi |
| 2010/0250836 A1 | 9/2010 | Sokolov et al. |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1605509 A1 | 12/2005 |
| WO | 9610256 A1 | 4/1996 |
| WO | 98028745 A1 | 7/1998 |
| WO | 02100112 A1 | 12/2002 |
| WO | 2003100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |

(56) References Cited

FOREIGN PATENT DOCUMENTS

| | | |
|---|---|---|
| WO | 2009078006 A2 | 6/2009 |
| WO | 2009095902 A2 | 8/2009 |
| WO | 2011024015 A1 | 3/2011 |

OTHER PUBLICATIONS

Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
Agrell et al., "Closest Point Search in Lattices", IEEE Transactions on Information Theory, vol. 48, No. 8, pp. 2201-2214, Aug. 2002.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
Berman et al., "Mitigating Inter-Cell Coupling Effects in MLC NAND Flash via Constrained Coding", Flash Memory Summit, Santa Clara, USA, Aug. 19, 2010.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May, 1984, section 3.2, pp. 47-48.
Conway et al., "Sphere Packings, Lattices and Groups", 3rd edition, chapter 4, pp. 94-135, Springer, New York, US 1998.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Compaq et al., "Universal Serial Bus Specification", revision 2.0, Apr. 27, 2000.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), p. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Engineering Windows 7, "Support and Q&A for Solid-State Drives", e7blog, May 5, 2009.
Goodman et al., "On-Chip ECC for Multi-Level Random Access Memories," Proceedings of the IEEE/CAM Information Theory Workshop, Ithaca, USA, Jun. 25-29, 1989.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
Horstein, "On the Design of Signals for Sequential and Nonsequential Detection Systems with Feedback," IEEE Transactions on Information Theory IT-12:4 (Oct. 1966), pp. 448-455.
How to Resolve Bad Super Block: Magic Number Wrong in BSD, Free Online Articles Director Article Base, posted Sep. 5, 2009.
Huffman, A., "Non-Volatile Memory Host Controller Interface (NVMHCI)", Specification 1.0, Apr. 14, 2008.
Jedec Standard JESD84-C44, "Embedded MultiMediaCard (eMMC) Mechanical Standard, with Optional Reset Signal", Jedec Solid State Technology Association, USA, Jul. 2009.
Jedec, "UFS Specification", version 0.1, Nov. 11, 2009.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Micron Technology Inc., "Memory Management in NAND Flash Arrays", Technical Note, year 2005.
Numonyx, "M25PE16: 16-Mbit, page-erasable serial flash memory with byte-alterability, 75 MHz SPI bus, standard pinout", Apr. 2008.
Onfi, "Open NAND Flash Interface Specification," revision 1.0, Dec. 28, 2006.

(56) References Cited

OTHER PUBLICATIONS

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
Park et al., "Sub-Grouped Superblock Management for High-Performance Flash Storages", IEICE Electronics Express, vol. 6, No. 6, pp. 297-303, Mar. 25, 2009.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
SD Group and SD Card Association, "SD Specifications Part 1 Physical Layer Specification", version 3.01, draft 1.00, Nov. 9, 2009.
Serial ATA International Organization, "Serial ATA Revision 3.0 Specification", Jun. 2, 2009.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Super User Forums, "SD Card Failure, can't read superblock", posted Aug. 8, 2010.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Takeuchi et al., "A Multipage Cell Architecture for High-Speed Programming Multilevel NAND Flash Memories", IEEE Journal of Solid State Circuits, vol. 33, No. 8, Aug. 1998.
Ubuntu Forums, "Memory Stick Failed IO Superblock", posted Nov. 11, 2009.
Wei, L., "Trellis-Coded Modulation With Multidimensional Constellations", IEEE Transactions on Information Theory, vol. IT-33, No. 4, pp. 483-501, Jul. 1987.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Search Report dated May 30, 2008.
International Application PCT/IL2007/000576 Search Report dated Jul. 7, 2008.
International Application PCT/IL2007/000579 Search report dated Jul. 3, 2008.
International Application PCT/IL2007/000580 Search Report dated Sep. 11, 2008.
International Application PCT/IL2007/000581 Search Report dated Aug. 25, 2008.
International Application PCT/IL2007/001059 Search report dated Aug. 7, 2008.
International Application PCT/IL2007/001315 search report dated Aug. 7, 2008.
International Application PCT/IL2007/001316 Search report dated Jul. 22, 2008.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
U.S. Appl. No. 11/957,970 Official Action dated May 20, 2010.
U.S. Appl. No. 12/171,797 Official Action dated Aug. 25, 2010.
U.S. Appl. No. 11/945,575 Official Action dated Aug. 24, 2010.
U.S. Appl. No. 12/497,707 Official Action dated Sep. 15, 2010.
U.S. Appl. No. 11/995,801 Official Action dated Oct. 15, 2010.
U.S. Appl. No. 12/045,520 Official Action dated Nov. 16, 2010.
U.S. Appl. No. 12/388,528 Official Action dated Nov. 29, 2010.
U.S. Appl. No. 11/995,814 Official Action dated Dec. 17, 2010.
U.S. Appl. No. 12/251,471 Official Action dated Jan. 3, 2011.
U.S. Appl. No. 12/534,898 Official Action dated Mar. 23, 2011.
Chinese Application # 200780026181.3 Official Action dated Apr. 8, 2011.
U.S. Appl. No. 12/178,318 Official Action dated May 31, 2011.
U.S. Appl. No. 11/995,813 Official Action dated Jun. 16, 2011.
U.S. Appl. No. 12/344,233 Official Action dated Jun. 24, 2011.
Chinese Patent Application # 200780040493.X Official Action dated Jun. 15, 2011.
U.S. Appl. No. 12/405,275 Official Action dated Jul. 29, 2011.
U.S. Appl. No. 12/649,360 Official Action dated Aug. 9, 2011.
U.S. Appl. No. 13/114,049 Official Action dated Sep. 12, 2011.
U.S. Appl. No. 12/037,487 Official Action dated Oct. 3, 2011.
U.S. Appl. No. 12/534,893, filed Aug. 4, 2009.
U.S. Appl. No. 12/551,583, filed Sep. 1, 2009.
U.S. Appl. No. 12/551,567, filed Sep. 1, 2009.
U.S. Appl. No. 12/579,430, filed Oct. 15, 2009.
U.S. Appl. No. 12/579,432, filed Oct. 15, 2009.
U.S. Appl. No. 12/607,078, filed Oct. 28, 2009.
U.S. Appl. No. 12/607,085, filed Oct. 28, 2009.
U.S. Appl. No. 12/649,358, filed Dec. 30, 2009.
U.S. Appl. No. 12/649,360, filed Dec. 30, 2009.
U.S. Appl. No. 12/688,883, filed Jan. 17, 2010.
U.S. Appl. No. 12/728,296, filed Mar. 22, 2010.
U.S. Appl. No. 12/758,003, filed Apr. 11, 2010.
U.S. Appl. No. 12/880,101, filed Sep. 12, 2010.
U.S. Appl. No. 12/890,724, filed Sep. 27, 2010.
U.S. Appl. No. 12/822,207, filed Jun. 24, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
U.S. Appl. No. 13/114,049, filed May 24, 2011.
U.S. Appl. No. 13/170,202, filed Jun. 28, 2011.
U.S. Appl. No. 13/171,467, filed Jun. 29, 2011.
U.S. Appl. No. 13/176,761, filed Jul. 6, 2011.
U.S. Appl. No. 13/192,495, filed Jul. 28, 2011.
U.S. Appl. No. 13/231,963, filed Sep. 14, 2011.
U.S. Appl. No. 13/192,504, filed Jul. 28, 2011.
U.S. Appl. No. 13/192,852, filed Aug. 2, 2011.
U.S. Appl. No. 13/214,257, filed Aug. 22, 2011.
U.S. Appl. No. 13/239,408, filed Sep. 22, 2011.
U.S. Appl. No. 13/239,411, filed Sep. 22, 2011.
US 7,161,836, 01/2007, Wan et al. (withdrawn)

\* cited by examiner

US 8,767,459 B1

DATA STORAGE IN ANALOG MEMORY CELLS ACROSS WORD LINES USING A NON-INTEGER NUMBER OF BITS PER CELL

CROSS-REFERENCE TO RELATED APPLICATIONS

This application claims the benefit of U.S. Provisional Patent Application 61/369,667, filed Jul. 31, 2010, and U.S. Provisional Patent Application 61/475,241, filed Apr. 14, 2011, whose disclosures are incorporated herein by reference. This application is related to a U.S. patent application Ser. No. 13/192,495 entitled "Data storage in analog memory cells using a non-integer number of bits per cell", filed on even date, whose disclosure is incorporated herein by reference.

FIELD OF THE INVENTION

The present invention relates generally to data storage, and particularly to methods and systems for storing data in analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Some storage schemes store data at a density having a non-integer number of bits per memory cell. For example, U.S. Pat. No. 7,071,849, whose disclosure is incorporated herein by reference, describes fractional-bit systems that allow increments of the number of states per cell by as little as one between product generations. Because the number of states per cell is not an integer power of two, the number of bits per cell takes a fractional value. Cells are typically decoded in unit of word, and the system efficiency can be optimized by adjusting the word-width.

As another example, U.S. Pat. No. 6,646,913, whose disclosure is incorporated herein by reference, describes a method for storing and reading data in a multilevel nonvolatile memory having a memory array formed by a plurality of memory cells. Each of the memory cells stores a number of bits that is not an integer power of two. In this way, one data byte is stored in a non-integer number of memory cells. The managing method includes storing, in the same clock cycle, a data word formed by a plurality of bytes, by programming a preset number of adjacent memory cells. Reading is performed by reading the stored data word in the same clock cycle.

SUMMARY OF THE INVENTION

An embodiment of the present invention that is described herein provides a method for data storage. The method includes accepting data for storage in an array of analog memory cells, which are arranged in rows associated with respective word lines. At least a first page of the data is stored in a first row of the array, and at least a second page of the data is stored in a second row of the array, having a different word line from the first row. After storing the first and second pages, a third page of the data is stored jointly in the first and second rows.

In some embodiments, storing the third page includes selecting respective programming levels at least for one memory cell in the first row and one memory cell in the second row based on a given bit value of the third page. In an embodiment, storing the third page includes storing a given bit of the third page by: selecting a first programming level for a first memory cell in the first row based on the given bit of the third page and on a corresponding first bit of the first page; selecting a second programming level for a second memory cell in the second row based on the given bit of the third page and on a corresponding second bit of the second page; and programming the first and second memory cells to the selected first and second programming levels, respectively.

In another embodiment, storing the third page includes storing a given bit of the third page by: selecting a first programming level for a first memory cell in the first row, and a second programming level for a second memory cell in the second row, based on the given bit of the third page, on a corresponding first bit of the first page and on a corresponding second bit of the second page; and programming the first and second memory cells to the selected first and second programming levels, respectively. In yet another embodiment, storing the first, second and third pages includes executing respective, different first, second and third page programming commands.

In a disclosed embodiment, the method includes performing at least one storage operation in a third row, which neighbors the first row or the second row, after storing the first page and before storing the third page. In still another embodiment, storing the third page includes programming the memory cells in the first and second row using a number of programming levels that is not an integer power of two. In an embodiment, each of the memory cells is programmable to a respective set of programming levels, and storing the third page includes selecting the programming levels at least for a first memory cell in the first row and a second memory cell in the second row from a partial subset of possible combinations of the programming levels of the first and second memory cells.

There is additionally provided, in accordance with an embodiment of the present invention, a method for data storage including accepting data for storage in an array of analog memory cells, which are arranged in rows associated with respective word lines. Bit values of the data are mapped to programming levels of the analog memory cells, such that at least one bit value is encoded by the programming levels of at least two analog memory cells belonging to different, respective word lines of the array. The data is stored by programming the analog memory cells to the programming levels mapped to the bit values.

In some embodiments, accepting the data includes accepting at least first, second and third pages, and mapping the bit values includes mapping corresponding bit values of the first and third pages to respective programming levels for the memory cells in a first word line, and mapping corresponding bit values of the second and third pages to respective programming levels for the memory cells in a second word line, different from the first word line. In an embodiment, storing the data includes programming the analog memory cells belonging to the different word lines using respective, different page programming commands. In another embodiment, a number of the programming levels is not an integer power of two.

There is also provided, in accordance with an embodiment of the present invention, a method for data storage including accepting and buffering second data for storage in an array of analog memory cells, which are arranged in rows associated with respective word lines and in which first data is potentially already stored. The buffered second data is stored in a given row of the array by: assessing a first size of the first data that is potentially already stored in the given row; assessing a second size of the second data that is buffered for storage; selecting a programming operation from among multiple predefined programming operations depending on the first and second sizes; and storing the buffered second data in the given row using the selected programming operation.

In some embodiments, assessing the first and second sizes includes identifying the first and second sizes at a granularity of half a page of the data. In a disclosed embodiment, at least one of the predefined programming operations stores a full page of the data in the given row when the given row already holds half a page of the data.

There is further provided, in accordance with an embodiment of the present invention, apparatus for data storage including a memory and storage circuitry. The memory includes an array of analog memory cells that are arranged in rows associated with respective word lines. The storage circuitry is configured to accept data for storage in the array, to store at least a first page of the data in a first row of the array, to store at least a second page of the data in a second row of the array, having a different word line from the first row, and, after storing the first and second pages, to store a third page of the data jointly in the first and second rows.

There is moreover provided, in accordance with an embodiment of the present invention, apparatus for data storage including a memory and storage circuitry. The memory includes an array of analog memory cells that are arranged in rows associated with respective word lines. The storage circuitry is configured to accept data for storage in the array, to map bit values of the data to programming levels of the analog memory cells, such that at least one bit value is encoded by the programming levels of at least two analog memory cells belonging to different, respective word lines of the array, and to store the data by programming the analog memory cells to the programming levels mapped to the bit values.

There is additionally provided, in accordance with an embodiment of the present invention, apparatus for data storage including a memory and storage circuitry. The memory includes an array of analog memory cells that are arranged in rows associated with respective word lines. The storage circuitry is configured to accept and buffer second data for storage in the array while first data is potentially already stored in the array, and to store the buffered second data in a given row of the array by assessing a first size of the first data that is potentially already stored in the given row, assessing a second size of the second data that is buffered for storage, selecting a programming operation from among multiple predefined programming operations depending on the first and second sizes, and storing the buffered second data in the given row using the selected programming operation.

The present invention will be more fully understood from the following detailed description of the embodiments thereof, taken together with the drawings in which:

DETAILED DESCRIPTION OF EMBODIMENTS

Overview

Figure 1:
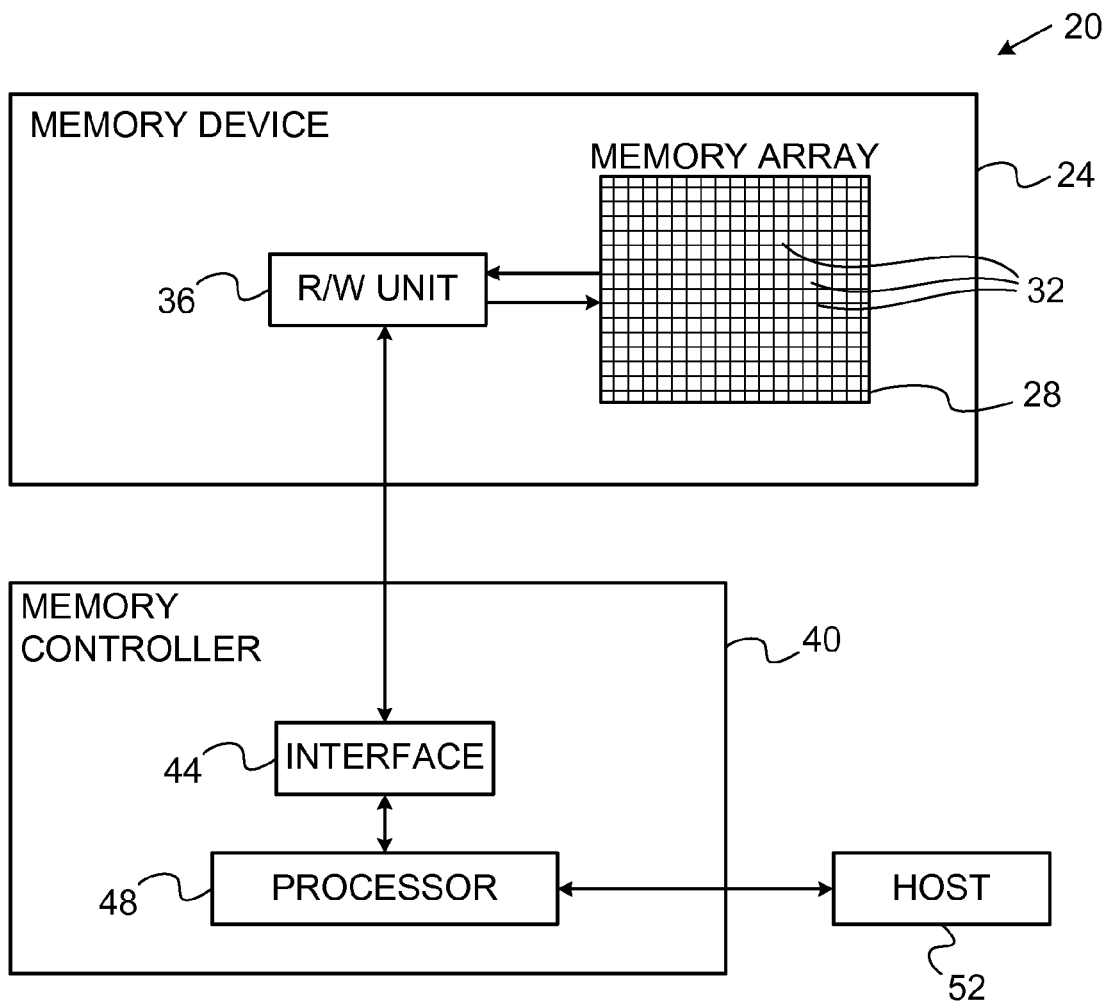
FIG. 1 is a block diagram that schematically illustrates a memory system, in accordance with an embodiment of the present invention.

Storing data in analog memory cells at a non-integer number of bits per memory cell means that the storage process is not constrained to use a number of programming levels that is an integer power of two. The finer granularity in defining the programming levels enables better exploitation of the capacity of the memory cells.

On the other hand, storing data in this manner sometimes collides with operating conventions of analog memory devices, such as maintaining a standard page size, storing multiple separate pages in each word line, and reducing interference by programming word lines in a gradual, alternating order. Storage at a non-integer number of bits per cell may also increase the size of memory buffers used in the storage process.

Embodiments of the present invention provide improved methods and systems for data storage, which reduce or eliminate the performance degradation that is conventionally associated with storage at a non-integer number of bits per memory cell.

In some embodiments, a memory system accepts data pages for storage in an array of analog memory cells. The system stores a first page in one word line (row) of the array, a second page in another word line, and a third page jointly in the two word lines. In a typical embodiment, joint storage means that each bit of the third page determines the programming levels in a respective pair of memory cells, one memory cell in each word line. These techniques enable the system to increase storage density while maintaining a standard page size. This scheme may be applied not only in storing three pages in two word lines as in the above example, but also to storing larger numbers of pages per word line.

In other disclosed embodiments, the memory system selects how to store data in a given word line depending on (i) the size of the data that is already stored in the given word line and (ii) the size of the data that is currently buffered and pending for storage. Based on these two data sizes, the system selects a programming operation from a set of possible operations, and stores the pending data using the selected operation. The programming operation may involve storing a non-integer number of bits per cell in the word line. In an example embodiment, the data sizes are assessed at a granularity of half a page. In at least one of the possible programming operations, a full page of data is programmed in a word line that already holds half a page. These techniques can be combined with alternating word line programming orders, so as to reduce interference.

In some disclosed embodiments, the memory system stores data in a group of analog memory cells using a two-phase process. In the first phase, the system programs the memory cells in the group to a set of initial programming levels, whose size is typically an integer power of two. In the second phase, the system stores additional data, but only in those memory cells that were programmed in the first phase to certain specific initial programming levels in a certain predefined partial subset of the initial programming levels.

The second phase thus produces one or more additional programming levels that are different from the initial programming levels. The aggregate number of the initial and additional programming levels is typically not an integer power of two. Several example programming and readout schemes of this sort are described. These techniques approach the theoretical capacity of the memory cells, and at the same time enable efficient interference mitigation and require only modest buffering.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array may comprise solid-state analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The techniques described herein mainly address storage densities of a non-integer number of bits per memory cell, i.e., a number of programming levels per cell that is not an integer power of two.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a memory controller 40. Memory controller 40 comprises an interface 44 for communicating with memory device 24, and a processor 48. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present invention, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Erasing of cells is usually carried out in blocks that contain multiple pages. Typical memory devices may comprise thousands of erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

Data Storage Across Word Lines Using a Non-Integer Number of Bits Per Memory Cell In some embodiments, system 20 stores data in memory cells 32 of array 28 at a storage density of a non-integer number of bits per memory cell, i.e., using a number of programming levels that is not an integer power of two. Such programming schemes enable the system to better exploit the capacity of the memory cells. For example, certain memory cells may not enable reliable storage using four programming levels per cell (2 bits/cell) but do enable reliable storage using three programming levels per cell (1.5 bits/cell).

Storage using a non-integer number of bits per cell sometimes collides with operating conventions of analog memory devices, such as standard page size, storage of multiple independently-programmed pages in each word line, or programming orders of word lines for reducing interference. The disclosed techniques resolve this apparent contradiction.

In some embodiments described below, system 20 achieves a non-integer number of bits per cell by jointly defining the programming levels of the memory cells across multiple word lines. In other words, when mapping the data bit values to memory cell programming levels, at least one bit value is encoded by the programming levels of at least two analog memory cells belonging to different, respective word lines. In a typical embodiment, at least a first page is stored in memory cells of one word line, at least a second page is stored in memory cells of another word line, and, at a later point in time, a third page is stored jointly in memory cells of both word lines.

Joint mapping of bit values to programming levels for corresponding memory cells in different word lines (rather than for multiple memory cells in the same word line) can be implemented using simple logic hardware or software while preserving the storage conventions of the memory device. Typically, different word lines are programmed using different page programming commands. Thus, the memory cells whose programming levels are affected by this joint mapping are typically programmed using different page programming commands.

Figure 2:
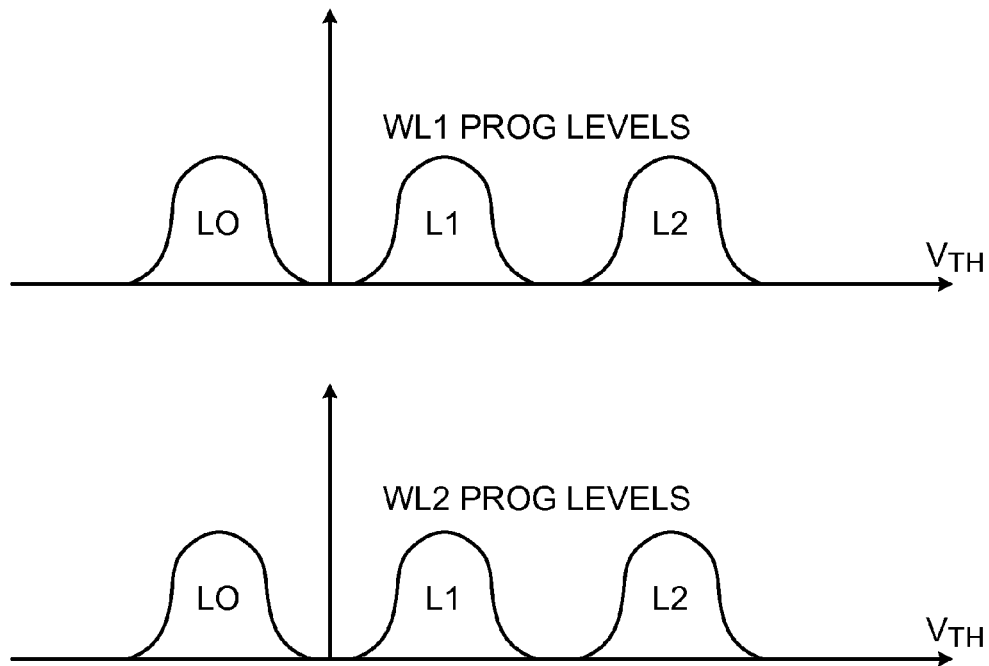
FIG. 2 is a graph showing programming levels of memory cells belonging to two word lines, in accordance with an embodiment of the present invention.
Figure 3:
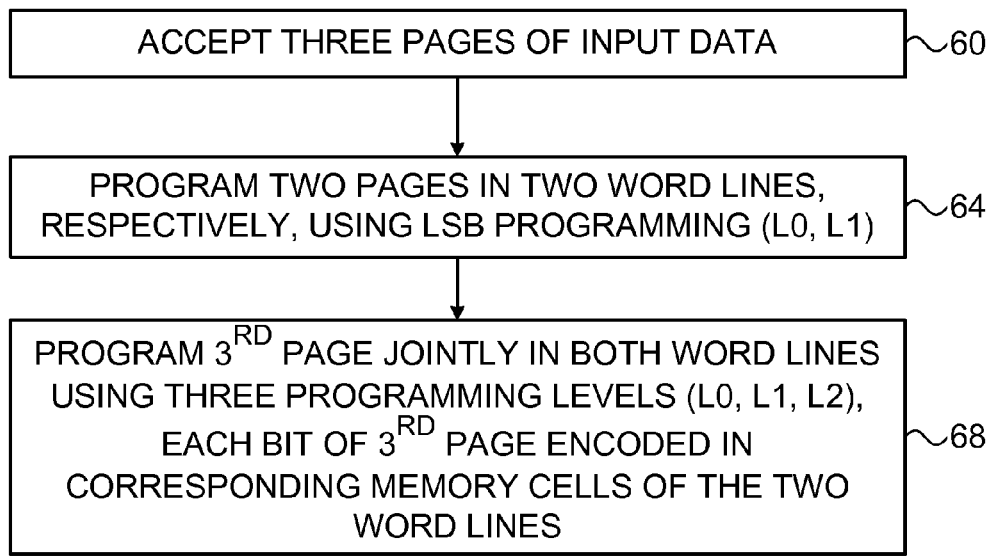
FIG. 3 is a flow chart that schematically illustrates a method for storing three data pages in memory cells belonging to two word lines, in accordance with an embodiment of the present invention.
Figure 4:
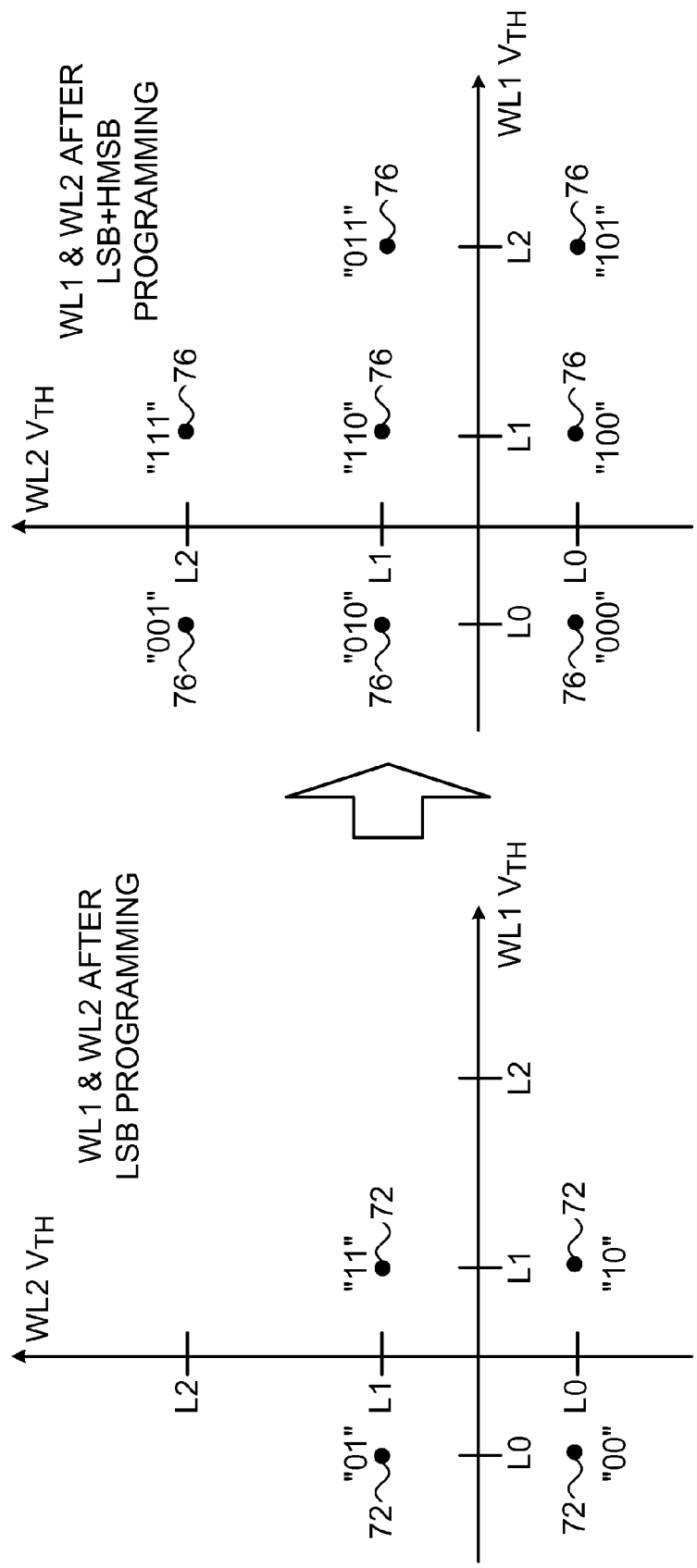
FIG. 4 is a diagram that schematically illustrates a process of storing three data pages in memory cells belonging to two word lines, in accordance with an embodiment of the present invention.

FIGS. 2-4 below show an example embodiment in which three data pages are stored in the memory cells of two word lines of array 28, using three programming levels per cell (1.5 bits/cell).

FIG. 2 is a graph showing programming levels of memory cells belonging to two word lines, in accordance with an embodiment of the present invention. The two word lines in question are denoted WL1 and WL2. Each memory cell can be programmed to one of three possible programming levels denoted L0, L1 and L2. L0 also serves as the erased level, i.e., erased memory cells are set to this level. Each of the three programming levels occupies a respective range of threshold voltages ($V_{TH}$) as seen in the figure. Typically although not necessarily, L0 occupies a range of negative threshold voltages while L1 and L2 occupy ranges of positive threshold voltages.

System 20 stores three data pages in two word lines of this sort. A first data page is stored in WL1, one bit in each memory cell, using levels L0 and L1. A second data page is stored in WL2 in a similar manner, one bit in each memory cell, using levels L0 and L1. A third data page is stored jointly in WL1 and WL2, one bit in every pair of corresponding memory cells in the two word lines, using all three levels L0, L1 and L2.

FIG. 3 is a flow chart that schematically illustrates a method for storing three data pages in memory cells belonging to two word lines, in accordance with an embodiment of the present invention. The method begins with memory controller 40 accepting three data pages for storage, at an input step 60. The memory controller stores the first and second data pages in word lines WL1 and WL2, respectively, at a first storage step 64. This storage step uses only programming levels L0 and L1. In an example embodiment, one data bit is stored in each memory cell, such that "0" bit value is mapped to level L0 and "1" bit value is mapped to level L1. This programming step is referred to herein as Least Significant Bit (LSB) programming of the two word lines.

The memory controller then programs the third data page jointly in the memory cells of the two word lines, at a second programming step 68. This programming step is referred to herein as Half Most Significant Bit (HMSB) programming of the two word lines. After LSB programming and before HMSB programming, each memory cell in WL1 and WL2 is already LSB-programmed using levels L0 and L1. The memory controller now re-programs word lines WL1 and WL2, using all three programming levels L0 ... L2, such that each bit of the third data page defines the programming levels in a respective pair of corresponding memory cells in WL1 and WL2.

In this scheme, the programming level of the $n^{th}$ memory cell of WL1 depends on the value of the $n^{th}$ bit of the first data page (which was already programmed at step 64 above) and on the value of the $n^{th}$ bit of the third data page. The programming level of the $n^{th}$ memory cell of WL2 depends on the value of the $n^{th}$ bit of the second data page (which was programmed at step 64 above) and on the value of the $n^{th}$ bit of the third data page. Thus, the value of the $n^{th}$ bit of the third data page determines the programming levels of both the $n^{th}$ memory cell of WL1 and the $n^{th}$ memory cell of WL2.

When implementing the programming scheme of FIGS. 2 and 3, various types of mapping between bit values and programming levels can be used for the LSB and HMSB programming steps. Typically, however, the threshold voltages of analog memory cells 32 can only be increased when carrying out the HMSB programming. Thus, the HMSB programming scheme is typically permitted only to leave a memory cell at its present programming level or shift it to a higher programming level.

In alternative embodiments, the mapping of the bit values of the third data page to the programming levels of WL1 and WL2 is not separable. In other words, the programming level of the $n^{th}$ memory cells in both WL1 and WL2 depend on (i) the value of the $n^{th}$ bit of the first data page, (ii) the value of the $n^{th}$ bit of the second data page, and (iii) the value of the $n^{th}$ bit of the third data page.

FIG. 4 is a diagram that schematically illustrates an example mapping of bit values to programming levels in the LSB and HMSB programming steps, in accordance with an embodiment of the present invention. The left hand side of the figure shows the threshold voltages (and corresponding programming levels) of the memory cells in WL1 and WL2 after LSB programming. For each pair of corresponding memory cells in WL1 and WL2 (i.e., the $n^{th}$ memory cell in WL1 and the $n^{th}$ memory cell in WL2), the threshold voltages of the two memory cells are shown as points 72 in a two-dimensional space. The horizontal axis shows the threshold voltage of the memory cell belonging to WL1, and the vertical axis shows the threshold voltage of the memory cell belonging to WL2.

This example mapping is defined by the following table:

| $1^{st}$ Page bit value | $2^{nd}$ page bit value | WL1 cell level | WL2 cell level |
|---|---|---|---|
| 0 | 0 | L0 | L0 |
| 0 | 1 | L0 | L1 |
| 1 | 0 | L1 | L0 |
| 1 | 1 | L1 | L1 |

As can be seen in the table, the first and second data pages are stored independently into WL1 and WL2, respectively.

The right hand side of FIG. 4 shows the threshold voltages (and corresponding programming levels) of the memory cells in WL1 and WL2 after LSB and HMSB programming. At this stage, the bits of the third data page are programmed into respective pairs of corresponding memory cells in WL1 and WL2. The threshold voltages of the pairs of memory cells are shown as points 76 in the two-dimensional space.

The mapping of bit values to programming levels is defined by the following table:

| {$1^{st}$ page bit, $2^{nd}$ page bit} | $3^{rd}$ page bit | |
|---|---|---|
| | "0" | "1" |
| "00" | {L0, L0} | {L0, L2} |
| "01" | {L0, L1} | {L2, L1} |
| "10" | {L1, L0} | {L2, L0} |
| "11" | {L1, L1} | {L1, L2} |

The table gives the programming levels in the $n^{th}$ pair of corresponding WL1 and WL2 memory cells, as a function of the $n^{th}$ bit of the first, second and third data pages. When retrieving data from the memory cells, the three bit values can be read from a pair of WL1 and WL2 memory cells using the following inverse mapping:

|              | WL2 cell level |         |         |
| WL1 cell level | L0    | L1      | L2      |
| --- | --- | --- | --- |
| L0           | "000"          | "010"   | "001"   |
| L1           | "100"          | "110"   | "111"   |
| L2           | "101"          | "011"   | Unused  |

Typically, R/W unit 36 reads the three bit values from a pair of WL1 and WL2 memory cells by comparing the threshold values of the memory cells to certain read thresholds. When using the above-described mapping, the bit values can be recovered using the following threshold comparisons:

$LSB1 = Cell1 > X \& \sim([Cell1 > Y \& Cell2 > X])$ $LSB2 = Cell2 > X \& \sim([Cell1 < X \& Cell2 > Y])$ $MSB = Cell1 > Y | Cell2 > Y$ wherein LSB1 and LSB2 denote the bit values of the first and second data pages, respectively, MSB denotes the bit value of the third data page, Cell1 and Cell2 denote the threshold voltages of the WL1 and WL2 cells, respectively, X denotes the read threshold that differentiates between programming levels L0 and L1, Y denotes the read threshold that differentiates between programming levels L1 and L2, and &, | and ~ denote logical AND, OR and NOT operations, respectively.

In the present example, each individual data page can be read using two or three comparisons, i.e., two or three sense operations. All three data pages can be read using four comparisons i.e., four sense operations (two sense operations for each word line, one at threshold X and the other at threshold Y).

The mapping of bit values to programming levels shown in FIG. 4 is depicted purely by way of example. In alternative embodiments, any other suitable mapping can be used. The mapping can be selected depending on various criteria, such as, for example, minimizing the usage of level L2 in order to reduce the stress on the memory cells, or minimizing interference between word lines. Another example criterion is to choose the mapping as close as possible to Gray mapping, i.e., to minimize the number of bit differences between neighboring points 76 in the right-hand-side diagram of FIG. 4. Such a mapping would reduce bit error rate during data readout. The scheme of FIGS. 2-4 can be used with various page sizes. In an example embodiment each page comprises 8192 bytes (65536 bits), although any other suitable page size can be used in alternative embodiments.

The programming scheme of FIGS. 2-4 is an example scheme that is chosen purely for the sake of conceptual clarity. Alternatively, any other suitable programming scheme, in which at least a given bit value defines the programming levels of at least two memory cells belonging to different word lines, can be used. For example, a given bit value may define the programming levels of multiple memory cells belonging to more than two word lines. More generally, programming schemes that jointly map n bit values into m word lines can also be used.

Figure 10:
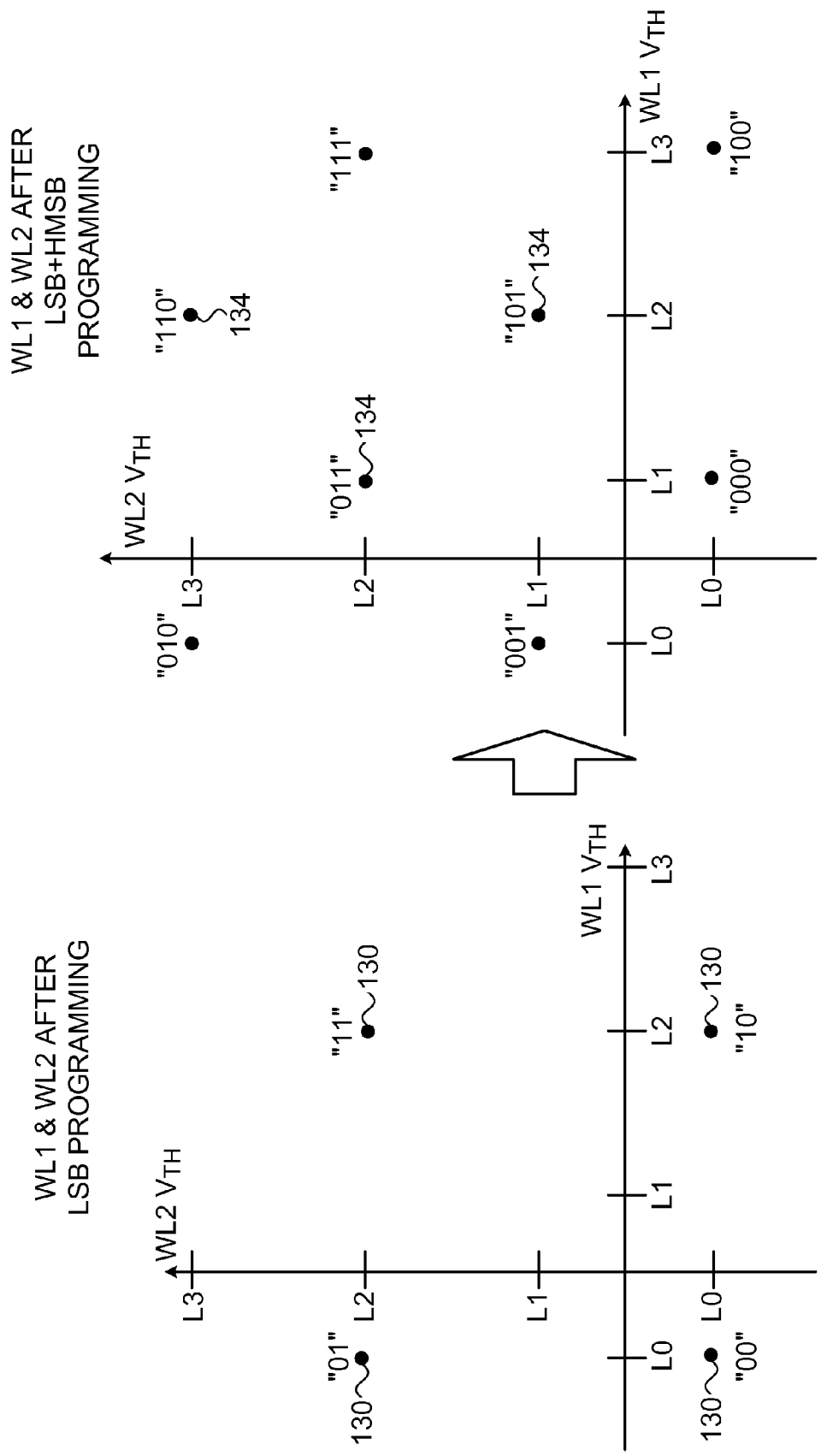
FIG. 10 is a diagram that schematically illustrates a process of storing three data pages in memory cells belonging to two word lines, in accordance with an alternative embodiment of the present invention.

In the example of FIGS. 2-4 the data is stored at a density of 1.5 bits/cell using a set of three programming levels. In alternative embodiments, any other suitable storage density and any other suitable number of programming levels can be used. An alternative programming scheme is shown in FIG. 10 further below. As yet another example, an alternative programming scheme may be defined with a set of six programming levels. Using such a scheme, a total of five data pages can be programmed into two word lines. The first four data pages are programmed using four programming levels, two pages into each word line. The fifth page is programmed jointly into the two word lines using all six programming levels.

In some embodiments, for a given pair of word lines, the HMSB programming (step 68 of FIG. 3) is performed immediately following LSB programming (step 64 of FIG. 3). This scheme reduces the need for buffering data in the memory controller or in the memory device. On the other hand, this scheme may be sub-optimal with respect to interference reduction, because it may apply large threshold voltage changes in the two word lines while neighboring word lines are not yet programmed.

In alternative embodiments, after performing LSB programming in a given pair of word lines, the HMSB programming in these word lines is postponed until one or more other neighboring word lines are LSB-programmed. This scheme reduces interference between word lines, but may require buffering of the HMSB data (the third data page to be stored using HMSB programming).

Storage at a Non-Integer Number of Bits Per Memory Cell Using Half-Page Granularity In some embodiments, system 20 stores data in memory device 24 at a granularity of half a page. The system may choose to store either half a page or a full page of data in a given word line, depending on the amount of data that is already stored in this word line, and on the amount of data that is buffered and pending for storage. The buffered data may be buffered in any suitable buffer memory (not shown) in memory controller 40 and/or memory device 24.

In these embodiments, when preparing to store data in a given word line, the system assesses the data size that is already stored in the word line (e.g., none, half a page, a full page or 1.5 pages) and the data size that is buffered for storage (e.g., half a page or a full page). The system chooses an appropriate programming operation, from among a set of predefined programming operations, based on these two assessments. In particular, as will be shown below, at least one of the predefined storage operations programs a full page of data into a word line that currently holds half a page.

In the description that follows, the terms "a word line holding half a page" and "a word line programmed with Half-LSB (HLSB)" are used interchangeably, the terms "a word line holding a full page" and "a LSB-programmed word line" are used interchangeably, and the terms "a word line holding 1.5 pages" and "a word line programmed with LSB+HMSB" are used interchangeably.

Storing data in this manner enables considerable flexibility in applying alternating programming orders among word lines, in order to reduce interference. For example, the disclosed technique can be used for storing data in a memory device in which the programming order of word lines is pre-dictated. At the same time, the disclosed technique reduces the buffer size used for buffering the data that is pending for storage.

Figure 5:
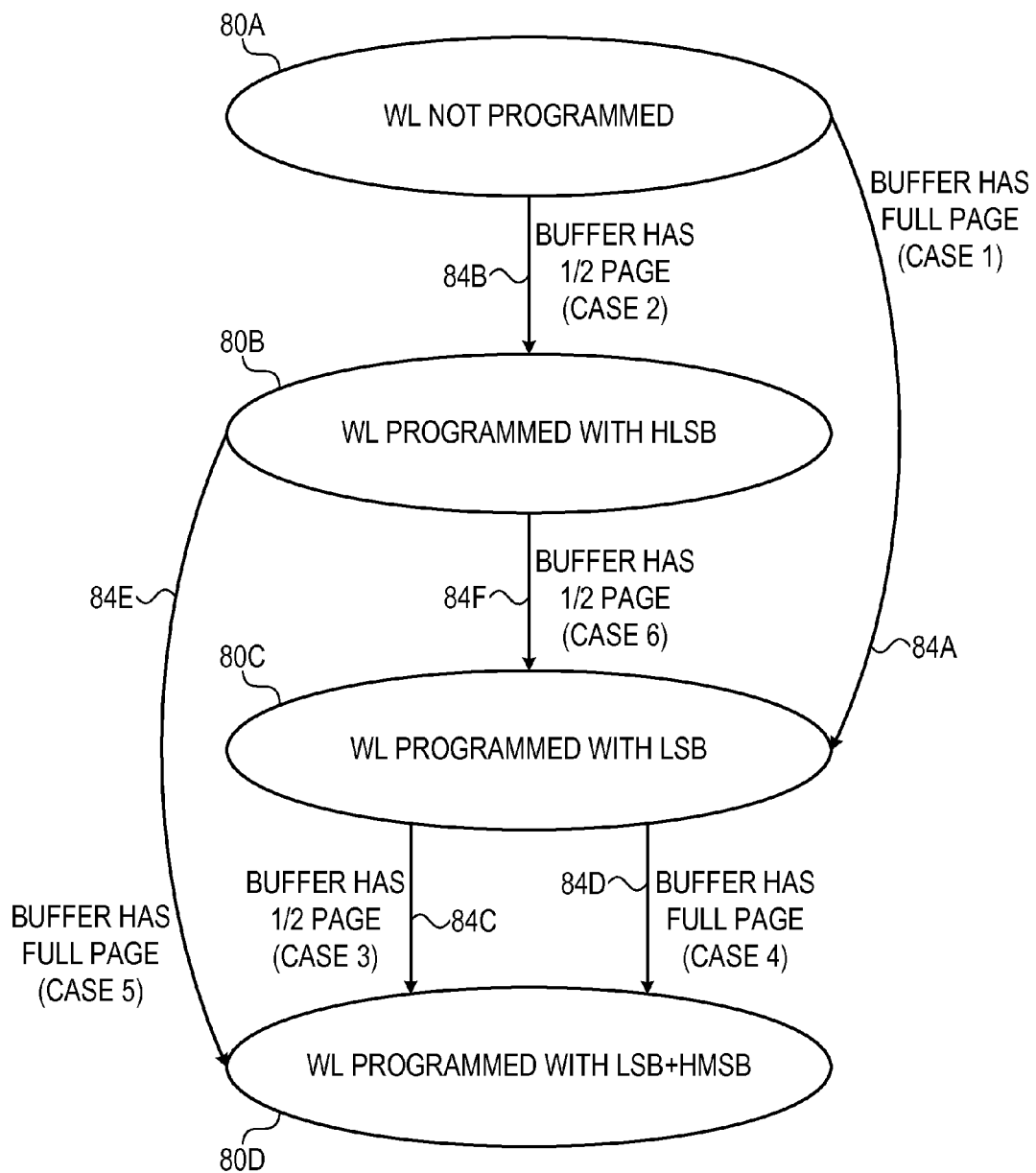
FIG. 5 is a state diagram that schematically illustrates a process of storing data across multiple word lines, in accordance with an embodiment of the present invention.

FIG. 5 is a state diagram that schematically illustrates a process of storing data using a non-integer number of bits per memory cell across multiple word lines, in accordance with an embodiment of the present invention. According to the state model of FIG. 5, a given word line may be in one of four states denoted 80A ... 80D. States 80A ... 80D correspond to the four possible data sizes that may already be stored in the memory cells of the word line: None, half a page, a full page, and 1.5 pages, respectively.

Six state transitions denoted 84A . . . 84F are defined between the states. Each transition corresponds to a respective programming operation that programs the memory cells of the word line from a certain state to another state. When preparing to store data in a given word line, system 20 checks the amount of data that the word line already holds i.e., determines the current state of the word line. Based on the amount of data that is buffered for storage, the system chooses the appropriate state transition, i.e., the appropriate programming operation.

In the example embodiment of FIG. 5, the system chooses the programming operation from a set of six possible programming operations that correspond to six cases, in accordance with the following table:

| Case # | Current WL state | Size of buffered data |
|---|---|---|
| 1 | 80A - not programmed | Full page |
| 2 | 80A - not programmed | Half page |
| 3 | 80C - holds full page | Half page |
| 4 | 80C - holds full page | Full page |
| 5 | 80B - holds Half a page | Full page |
| 6 | 80B - holds Half a page | Half page |

In case 1 (transition 84A), system 20 stores a full page of data in the word line using LSB programming. The word line at this stage is referred to as LSB programmed, i.e., at state 80C.

In case 2 (transition 84B), system 20 stores half a page into the un-programmed word line. In an example embodiment, the system stores the half page by applying LSB programming to half of the memory cells in the word line, while half of the memory cells remain un-programmed. The system may choose which memory cells to program at this stage in any desired manner, such as a physically contiguous half of the word line (e.g., first or last 50% of the memory cells in the word line), the odd-order memory cells, the even-order memory cells, or any other suitable subset that includes half of the memory cells. The choice of memory cells may have an effect on the level and predictability of cell-to-cell interference. The word line at this stage is referred to as HLSB programmed, i.e., at state 80B.

Typically, each memory cell in the subset that is programmed in case 2 is paired with a respective memory cell that is not programmed. The use of this pairing will be explained below. In an embodiment, the programming operation of case 2 sets the programming levels of the memory cells in a given pair according to the following table:

| HLSB value | Programming levels |
|---|---|
| "0" | L0, L0 |
| "1" | L0, L1 | wherein L0 and L1 refer to the programming levels shown in FIG. 2 above.

In case 3 (transition 84C), the word line already holds a full page, i.e., it is LSB programmed. The system stores an additional half a page (HMSB) in this word line, resulting in a word line that is LSB+HMSB programmed, i.e., reaching state 80D. In an embodiment, the programming operation of case 3 programs an additional bit into each pair of LSB-programmed memory cells in the word line. In an example embodiment, the programming operation of case 3 sets the programming levels of the memory cells in a given pair according to the following table:

| Current LSB values | HMSB value | |
|---|---|---|
| | "0" | "1" |
| "00" | L0, L0 | L0, L2 |
| "01" | L0, L1 | L2, L1 |
| "10" | L1, L0 | L2, L0 |
| "11" | L1, L1 | L1, L2 |

For example, if a given pair of memory cells is programmed to "0" and "1" LSB values, respectively, and the HMSB value to be programmed is "1", then the programming operation of case 3 will program the pair of memory cells to programming levels L2, L1, respectively.

In case 4 (transition 84D), the word line already holds a full page, i.e., it is LSB programmed, and an additional full page is buffered for storage. In this case, the system programs half of the buffered page in the given word line (resulting in a LSB+HMSB programmed word line). The system programs the other half of the buffered page in another word line, e.g., the next word line in the array. In an embodiment, the programming operation of case 4 programs half a page in the given word line using the programming operation of case 3 above. The other half page is programmed in the other word line depending on the state of that other word line, e.g., using the programming operation of case 2, 3 or 6.

In case 5 (transition 84E), the given word line already holds half a page (HLSB programmed). The system stores an additional full page (MSB) in this word line on top of the existing half page. In accordance with the above-described embodiment, the memory cells of the HLSB-programmed word line are paired. Within each pair, one memory cell is LSB-programmed and the other memory cell is un-programmed. In an embodiment, the programming operation of case 5 stores two additional bits in each such pair of memory cells.

In one embodiment, the programming operation of case sets the programming levels of the memory cells in a given pair according to the following table:

| Current programming levels | MSB values | | | |
|---|---|---|---|---|
| | "00" | "01" | "10" | "11" |
| L0, L0 | L0, L0 | L2, L0 | L1, L0 | L0, L2 |
| L0, L1 | L0, L1 | L0, L2 | L1, L1 | L1, L2 |

The programming operation of case 5 programs each pair of memory cells, one of which is un-programmed and the other LSB-programmed, to eight possible levels. Thus, after the programming operation of case 5, each pair of memory cells holds three bits. For example, if the pair of cells was at programming levels L0, L1, and the new bits to be stored are both "1", then the programming operation sets the pair of memory cells to programming levels L1, L2, respectively.

In case 6 (transition 84F), the word line already holds half a page (HLSB programmed). The system stores another half page in this word line, resulting in a LSB-programmed word line. The programming operation of case 6 may program the additional half page in various manners. In one embodiment, the memory cells in the HLSB-programmed word line are paired. In each pair, one memory cell is LSB-programmed and the other is un-programmed (e.g., following programming using case 2 above). In this embodiment, the programming operation of case 6 stores a bit in each un-programmed memory cell by applying LSB programming.

In an alternative embodiment, the new half page can be buffered until another half page is accepted for storage from host 52. Then, the two half pages are stored using the programming operation of case 5 above. This scheme may be advantageous since it reduces the wearing of the word line by programming it once instead of twice. Further alternatively, the mapping of bit values to programming levels can be defined such that case 6 does not occur.

The above-described state model, mapping tables and programming operations are shown purely by way of example. In alternative embodiments, any other suitable programming scheme can be used. Consider, for example, the cases where a certain page is split into two halves and each half stored in a different word line. In such a case, the page can be split in an interleaved manner, such that the odd-order bits are stored in one word line and the even-order bits are stored in another word line. Splitting the page in this manner simplifies the readout process, and in particular combining the read data from the two word lines in order to reconstruct the original page.

In an example embodiment, bits 1, 3, 5, 7, . . . of the original page are respectively stored in the pairs of memory cells [1,2], [3,4], [5,6], [7,8] . . . of one word line. Bits 2, 4, 6, 8, . . . of the original page are stored in the pairs of memory cells [1,2], [3,4], [5,6], [7,8] . . . of another word line.

As another example, consider the embodiments in which the memory cells in a given word line are paired, and a mapping is defined for storing data in each pair. In some embodiments, the roles of the memory cells within each pair are swapped from time to time, in order to balance the stress and wearing of the memory cells. In one embodiment, role swapping in a given memory block is carried out each time the memory block is erased. Alternatively, role swapping can be performed at any other suitable time.

Storage at a Non-Integer Number of Bits Per Memory Cell by Splitting a Partial Subset of the Programming Levels In some embodiments, system 20 stores data in a group of analog memory cells, e.g., a word line, in two programming phases. In the first phase, the system programs the memory cells in the group to a certain predefined set of initial programming levels. The number of initial programming levels is typically an integer power of two, e.g., two or four programming levels.

In a second programming phase, additional data is stored in the group, but only in the memory cells that were programmed to a predefined partial subset of the initial programming levels. The second programming phase sets at least some of these memory cells to additional programming levels that are different from the initial programming levels.

In other words, a certain subset of the initial programming levels is pre-designated for splitting into additional programming levels in order to store additional data. In the second programming phase, the system identifies the memory cells in the group that are programmed to this subset of programming levels, and programs only these memory cells with the additional data.

Note that the data size stored in the second phase is smaller than the data size stored in the second phase, since the second phase programs only a selected part of the memory cells in the group.

Typically, the total number of programming levels after the second programming phase, i.e., the aggregate number of the initial and additional programming levels, is not an integer power of two. Example schemes that reach an aggregate number of three, five, six, seven and nine programming levels are described below. Thus, these two-phase storage schemes store data at a non-integer number of bits per memory cell.

Figure 6:
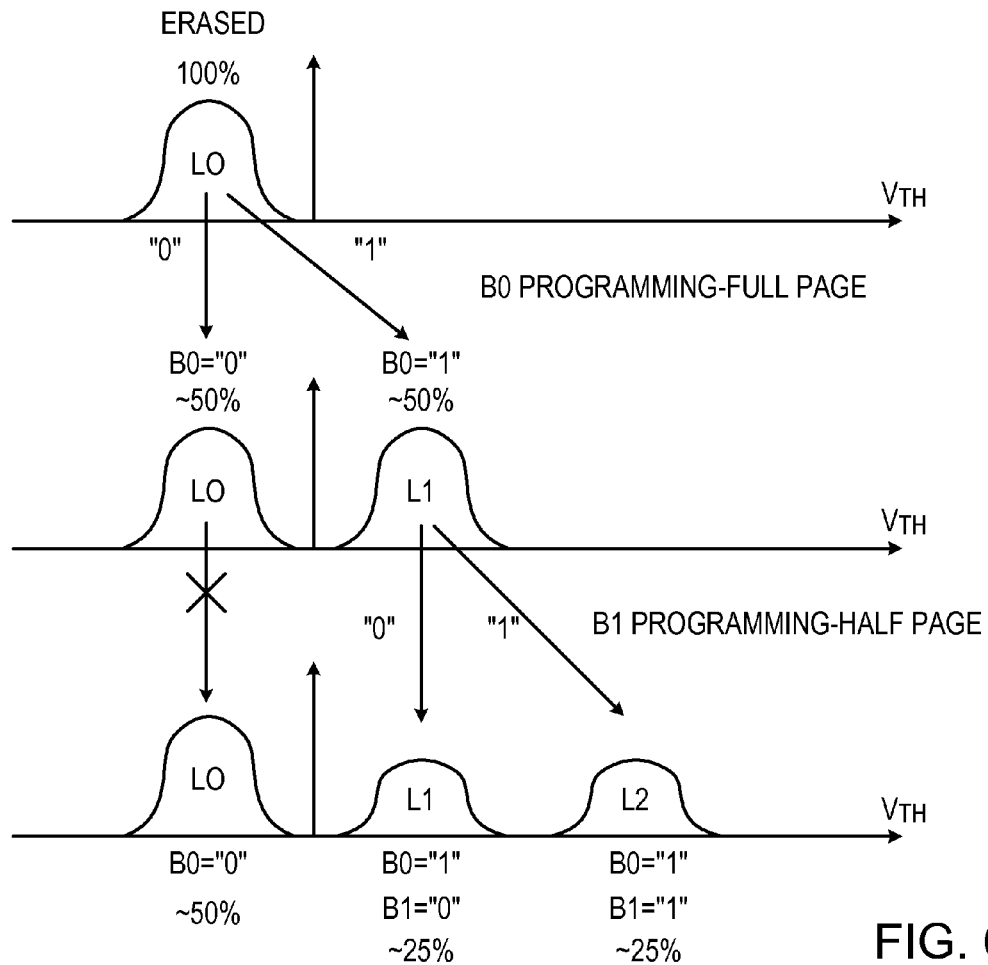
FIG. 6 is a graph showing a process of storing data using a non-integer number of bits per memory cell, in accordance with another embodiment of the present invention.

FIG. 6 is a graph showing data storage using the above-described two-phase process, in accordance with an example embodiment of the present invention. The top graph in FIG. 6 shows the threshold voltage distribution in a group of memory cells (e.g., a word line) before storage begins. At this stage, all the memory cells in the group are erased, i.e., set to level L0.

In the first programming phase, a full page of data denoted B0 is programmed into the memory cells in the group, one bit per memory cell. The middle graph in FIG. 6 shows the threshold voltage distribution in the group after this phase. In the present example, a B0="0" bit value is stored in a given memory cell by setting (retaining) the memory cell at programming level L0. A B0="1" bit value is stored by programming the memory cell to programming level L1.

In the second programming phase, the system identifies the memory cells that were programmed in the first phase to programming level L1, and stores an additional half-page (denoted B1) in these memory cells. The memory cells that were programmed in the first phase to programming level L0 are not programmed in the second phase.

The system stores half-page B1 by programming some of the memory cells of programming level L1 to programming level L2, and retaining the other memory cells of level L1 without additional programming. In the present example, the system stores a B1="1" bit value in a given memory cell (that is currently at level L1) by programming the memory cell to level L2. A B1="0" bit value is stored by retaining the memory cell at level L1.

The bottom graph in FIG. 6 shows the threshold voltage distribution in the group after the second programming phase. Typically, approximately 50% of the memory cells are at level L0, approximately 25% are at level L1, and approximately 25% are at level L2. At this stage, the group of memory cells holds 1.5 pages (B0 and B1) at an average storage density of 1.5 bits/cell.

The two-phase programming scheme of FIG. 6 achieves high capacity by enabling storage at a non-integer number of bits per memory cell. This scheme can also achieve good interference cancellation, because it can be applied in any suitable programming order of word lines, and requires only modest buffering. Thus, in some embodiments the system programs at least one neighboring word line after performing the first programming phase, and performs the second programming phase only after the neighboring word line is at least partially programmed.

In the present example, programming level L1 is pre-designated for splitting, and the second programming phase splits this level into levels L1 and L2. In alternative embodiments, however, any other programming level can be pre-designated for splitting. For example, the first programming phase may program the memory cells to levels L0 and L2, and the second programming phase may then program the memory cells of L0 into L0 and L1. Further alternatively, the first programming phase may program the memory cells to levels L0 and L1, and the second programming phase may then program the memory cells of L0 into L0 and L2.

In alternative embodiments, the disclosed two-phase process can be implemented, mutatis mutandis, using any suitable number of initial and additional programming levels. Several example variations of this scheme using various numbers of programming levels (and thus various storage capacities) are described further below.

Referring to the example of FIG. 6, after the first programming phase, approximately 50% of the memory cells are at programming level L0 and approximately 50% of the memory cells are at programming level L1. In some embodiments, for example, the data is scrambled before storage and the scrambling operation causes an approximate even distribution of "0" and "1" bit values. This 50%/50% distribution, however, is only approximate, and the actual percentages of "0" and "1" bit values may vary from one page to another.

The approximate distribution may be problematic for implementing the second programming phase. As noted above, the B1 half-page is stored only in the memory cells that are at level L1. Because of the approximate distribution, however, the number of these memory cells is not constant. If, for example, the number of memory cells at level L1 happens to be lower than 50%, the number of memory cells at level L1 may be insufficient for storing the B1 half-page.

In some embodiments, system 20 avoids situations of this sort by pre-processing the data of the B0 page before it is stored in the first programming phase. The pre-processing ensures that at least 50% of the memory cells in the group will be programmed to level L1 in the first programming phase. When this condition is met, the number of memory cells in level L1 is sufficient for storing the B1 half-page in the second programming phase.

(For a general number of programming levels, the pre-processing ensures that at least a predefined percentage of the memory cells in the group will be programmed in the first programming phase to the subset of the programming levels that are subsequently used for storing additional data in the second programming phase. This predefined percentage typically corresponds to the data size stored in the second phase.)

System 20 may apply any suitable kind of pre-processing to cause at least 50% of the memory cells in the group will be programmed to level L1. In an example embodiment, the system counts the number of bits in the B0 page that are to be mapped to level L1 (in the example of FIG. 6—the number of B0="1" bit values). If this number is smaller than 50% of the page size (equivalent to 50% of the number of memory cells in the group), the system inverts the data values of the B0 page. After inversion, the number of bit values that are to be mapped to level L1 is at least 50%. The system then carries out the two-phase storage process of FIG. 6.

Typically, for each group of memory cells, system 20 stores a respective indication of whether the bits of the B0 page were inverted or not before storage. The indication is referred to herein as an "inversion bit." The system may store the inversion bit in any suitable manner and at any suitable location, either in the same group of memory cells or in another storage location. Typically, the system stores the inversion bit using a highly reliable storage configuration, since an error in reading the inversion bit affects the entire data readout. When subsequently reading the B0 page from the group of memory cells, the system queries the inversion bit and, if necessary, inverts the read B0 bit values in order to reconstruct the data correctly.

In some embodiments, the system encodes the B0 page with an Error Correction Code (ECC) before storage. Typically, the pre-processing (e.g., counting of B0="1" bit values and bit inversion) should be applied to the bits of the ECC code words after ECC encoding, i.e., to the actual encoded bits that will be stored in the memory cells. In these embodiments, the inversion bit is produced after ECC encoding, and is therefore not protected by the ECC. System 20 may solve this issue, for example, by encoding the inversion bit with a separate ECC. The inversion bit can then be stored in a suitable storage location, typically outside the group of memory cells.

Alternatively to using an inversion bit, the system may designate a certain bit within the B0 page (before ECC encoding) and maintain this bit at a fixed predefined bit value (e.g., "0"). This bit is encoded with ECC together with the other bits of the B0 page. The system counts the number of "1" bit values in the encoded bits, and, if necessary, inverts the bit values in the entire code word. The system then carries out the storage process of FIG. 6. During data readout, following ECC decoding, if the designated bit is found to be "1" (i.e., the inverse of the fixed predefined bit value), the system concludes that the entire B0 page has been bit-wise inverted, and inverts all the B0 bit values. In this embodiment, the ECC is assumed to have the property that the bit-wise inverse of any code word is also a valid code word.

In yet another embodiment, the system applies pre-processing only to the data bits before ECC encoding and not to the parity bits added by the ECC. Since the number of parity bits is typically small relative to the overall page size, the inaccuracy of this scheme is often tolerable. In still another embodiment, the system checks whether the number of memory cells in level L1 is sufficient for storing the B1 half-page in the second programming phase. If not, the system does not program the B1 half-page in this group of memory cells, and proceeds to program the next group (e.g., the next word line).

In another embodiment, the system may scramble the data with different scrambler seeds until successfully causing at least 50% of the B0 page memory cells to be programmed to level L1. In another embodiment, the B1 half-page size can be defined as less than 50% of the full page size, in order to increase the probability of success. Generally, a trade-off exists between the size of the B1 half page and the probability of success in programming it. the smaller the size of the B1 half page, the higher the probability of success.

In yet another example embodiment, the system chooses whether to program the B1 half page into the memory cells that were programmed to level L0, or into the memory cells that were programmed to level L1. The system then stores an indication of this choice for subsequent decoding.

Figure 7:
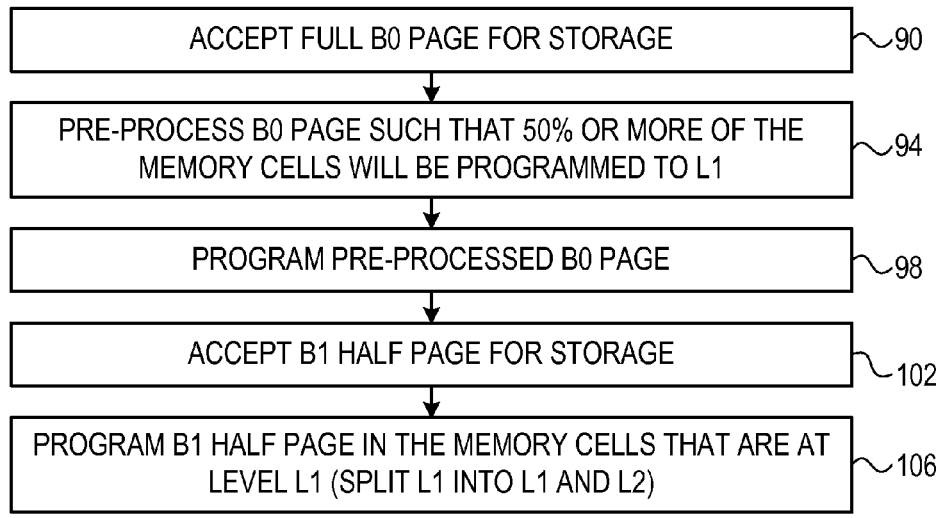
FIG. 7 is a flow chart that schematically illustrates a method for data storage using a non-integer number of bits per memory cell, in accordance with an embodiment of the present invention.

FIG. 7 is a flow chart that schematically illustrates a method for data storage using the two-phase process of FIG. 6 above, in accordance with an embodiment of the present invention. The method begins with system accepting a full page (B0) for storage, at a first input step 90. The system pre-processes the B0 page, at a pre-processing step 94, such that at least 50% of the B0 bits will be programmed to programming level L1 in the first programming phase. The system programs the pre-processed B0 page, at a first phase programming step 98.

The system accepts a half page (B1) for storage, at a second input step 102. (This step is shown after step for the sake of clarity. In alternative embodiments, the system may accept the B1 half page at any suitable time, e.g., together with accepting the B0 page at step 90.) The system identifies the memory cells that were programmed to level L1 in the first programming phase (step 98), and programs the B1 half page in the identified memory cells, at a second phase programming step 106.

Consider a group of memory cells that was programmed with a B0 page and a B1 half page to levels L0, L1 and L2. The threshold voltage distribution in this group is shown in the bottom graph of FIG. 6 above. In some embodiments, system 20 reads the B0 page from these memory cells by comparing the cell threshold values to a read threshold that is positioned between levels L0 and L1. For example, this read threshold can be positioned at or near 0V.

In order to read the B1 half page, the system should first identify the memory cells in which the bits of the B1 half page are stored, and then read the B1 half page from the identified memory cells. In the present example, the B1 half page is stored in the memory cells that were programmed to level L1 in the first programming phase, i.e., the memory cells for which the B0 bit is "1". Thus, in some embodiments, the system identifies the memory cells holding the B1 half page based on the read results of the B0 page.

Readout of the B0 page, however, typically involves some error probability. Any error in reading a bit of the B0 page will cause an error in identifying the memory cells that hold the B1 half page: Erroneously reading "0" instead of "1" in the B0 page will miss a memory cell that holds a bit of the B1 half page. Erroneously reading "1" instead of "0" in the B0 page will erroneously identify a memory cell as holding a bit of the B1 half page. Events of this sort will cause erroneous insertion and deletion of bits, rather than bit value errors, in the B1 half page. Such insertion and deletion errors are typically complicated to correct, and should be avoided.

For example, in some embodiments system 20 applies ECC decoding to the read B0 page before using the read results to identify the memory cells that hold the bits of the B1 half page. By using the error-corrected read results of the B0 page, the memory cells holding the B1 half page are identified with improved reliability, and the probability of introducing insertion or deletion errors is considerably reduced.

Figure 8:
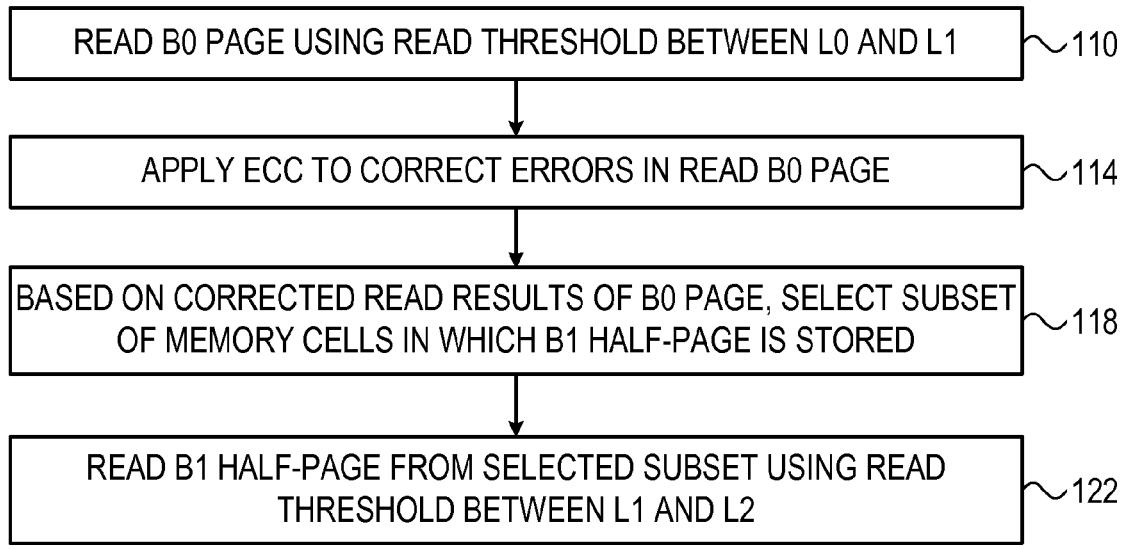
FIG. 8 is a flow chart that schematically illustrates a method for readout of data that is stored using a non-integer number of bits per memory cell, in accordance with an embodiment of the present invention.

FIG. 8 is a flow chart that schematically illustrates a method for readout of data that was stored using the process of FIG. 7 above, in accordance with an embodiment of the present invention. The method begins with system 20 reading the B0 page, at a first readout step 110. This readout step may be carried out in response to a request to retrieve the B0 page, or in preparation for retrieving the B1 half page. The system reads the B0 page by setting a read threshold in the boundary region between levels L0 and L1 (e.g., at or near 0V), and comparing the cell threshold voltages to the read threshold.

The system corrects read errors in the read B0 page by decoding the ECC, at an error correction step 114. Based on the error-corrected read results of the B0 page, the system selects the subset of memory cells in which the B1 half page is stored, at a cell selection step 118. For the example of FIG. 6 above, the system selects the memory cells for which the B0 bit value is "1".

The system then reads the B1 half page from the selected subset of memory cells, at a second readout step 122. The system reads the B1 half page by setting a read threshold in the boundary region between levels L1 and L2, and comparing the cell threshold voltages to the read threshold.

The two-phase programming scheme of FIG. 6 above can be generalized in a straightforward manner to any desired number of initial and additional programming levels. In the first programming phase, the memory cells are programmed to a certain set of initial programming levels. In the second programming phase, one or more of the initial programming levels are split, so as to produce respective additional programming levels.

In some embodiments, the second programming phase (e.g., programming of level L2 in the example of FIG. 6) can be used for marking memory cells that suffer from high distortion. Distortion may comprise, for example, disturb noise, stuck cell values that cause programming failure, overprogramming or any other kind of distortion. When the system identifies a certain cell as suffering from high distortion (e.g., during programming verification), the system programs one of the memory cells in the vicinity of the distorted cell using the second programming phase. The vicinity is defined because not every memory cell can be programmed in the second programming phase. The programmed cell may belong to the same word line as the distorted cell or to another word line.

During data readout, the cell that was programmed using the second programming phase is detected, and the system regards all the memory cells in the vicinity of this cell as potentially less reliable. In an example embodiment, the vicinity of a given cell is defined as a separation of up to thirty-two memory cells from the given cell along the same word line. Alternatively, any other suitable vicinity can be defined.

Consider, for example, a row of memory cells that are programmed in a first programming phase to four programming levels denoted L0 ... L3: {L0 L1 L3 L2 L0 L0 L1 L2 X L1 L2 L2 L2 L2 L3}. In this example, the memory cell marked with X suffers from high distortion. Assuming that a second programming phase programs the memory cells from level L3 to a new level L4, a subsequent memory cell can be programmed to L4 in order to mark this distortion. In this example, the programming levels after the second programming phase are {L0 L1 L3 L2 L0 L0 L1 L2 X L1 L2 L2 L2 L2 L4}. The marked cell is separated by five memory cells from the distorted cell. During readout, the cell programmed to L4 is identified, and the thirty-two cells preceding it are regarded as less reliable.

Figure 9:
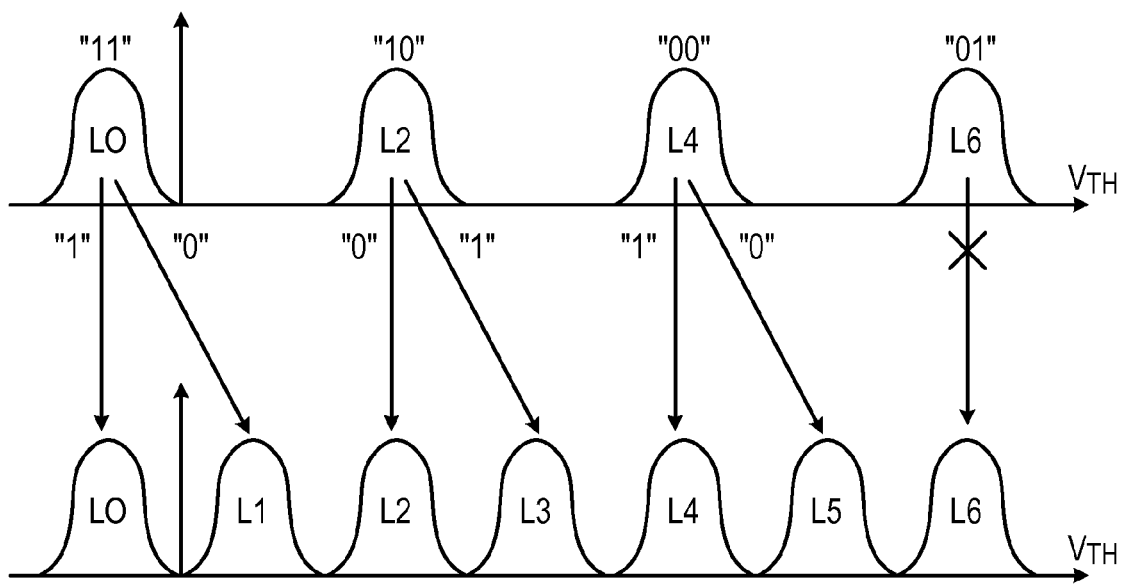
FIG. 9 is a graph showing a process of storing data using a non-integer number of bits per memory cell, in accordance with yet another embodiment of the present invention.

FIG. 9 is a graph showing a two-phase data storage process, in accordance with an embodiment of the present invention. In the present example, the memory cells are initially programmed with two pages, to four programming levels denoted L0, L2, L4 and L6. At this stage the average storage density is 2 bits/cell.

In the second programming phase, only the memory cells belonging to three of the four levels (L0, L2 and L4) are programmed with an additional bit. The data size stored in the second programming phase is ¾ of a page. Thus, levels L0, L2 and L4 are split to produce additional programming levels L1, L3 and L5, respectively. The memory cells belonging to level L6 are not programmed in the second programming phase. The second programming phase stores an additional data bit in 75% of the memory cells. The two-phase storage process thus produces seven programming levels, and the achieved average storage density is 2.75 bits/cell. This density is very close to the theoretical upper bound of $\log_2(7)=2.81$ bits/cell.

In order to guarantee a sufficient number of memory cells for the second programming phase, the pre-processing stage typically ensures that at least 75% of the memory cells will be programmed to level L0, L2 and L4. This condition can be met by using two inversion bits, one inversion bit for each of the pages stored in the first programming phase. (In an example pre-processing scheme, the first page is pre-processed using one inversion bit such that no more than 50% of the memory cells will be programmed to L4 and L6. This result is possible since after the first page is programmed, there are two voltage states, one corresponding to "0" bits of the $1^{st}$ programmed page and the other to "1" bits. When the second page is programmed, the lower voltage state splits into L0 and L2 and the higher state splits into L4 and L6. Therefore, it is enough to ensure that no more than 50% of the bits of the $1^{st}$ programmed page will be mapped to the higher state in order to make sure that no more than 50% of the memory cells will be programmed to L4 and L6. The second page is pre-processed using another inversion bit such that no more than 25% of the memory cells will be programmed to L6. This result is possible since during the programming of the $2^{nd}$ page, the higher voltage state is split into L4 and L6 according to the data bits of the $2^{nd}$ page, and therefore it is enough to ensure that no more than 50% of the data bits of the $2^{nd}$ page that cause splitting of the higher state will cause a split to L6.) The system may read the ¾ page that was stored in the second programming phase using ECC-corrected read results of the other two pages, generalizing the method of FIG. 8 above.

In some embodiments, mapping of bit values to programming levels in the seven-level scheme can be defined using Gray mapping. The mapping scheme of FIG. 9, for example, meets this condition as shown in the following table:

| Level | LSB of first phase | MSB of first phase | ¾ page of second phase |
|---|---|---|---|
| L0 | "1" | "1" | "1" |
| L1 | "1" | "1" | "0" |
| L2 | "1" | "0" | "0" |
| L3 | "1" | "0" | "1" |
| L4 | "0" | "0" | "1" |
| L5 | "0" | "0" | "0" |
| L6 | "0" | "1" | N/A |

In some embodiments, R/W unit 36 of memory device 24 comprises internal logic that performs LSB and MSB programming using four programming levels. This logic typically comprises two page buffers for holding the LSB page and MSB page to be programmed. In some embodiments, this logic can be used for implementing the seven-level programming schemes described above. In particular, this logic can be used to implement the second programming phase in which three out of four programming levels are split, so as to produce a total of seven final programming levels.

When performing MSB programming, the internal logic in the R/W unit typically sets for each memory cells one of three programming verification thresholds ("PV levels") depending on the LSB value and MSB value to be written into that cell. By appropriate setting of the bit values in the two page buffers and of the three PV levels, the system can cause the internal logic to carry out the splitting operation of the second programming phase. This action assumes that the system has access to the two page buffers.

In an example embodiment, the R/W unit carries out MSB programming in accordance with the following table:

| LSB value | MSB value | PV level |
|---|---|---|
| "1" | "1" | N/A |
| "1" | "0" | PV0 |
| "0" | "0" | PV1 |
| "0" | "1" | PV2 |

In order to use this mechanism to implement the second programming phase described above, the system sets the PV levels and the bit values in the LSB and MSB page buffers such that the R/W unit will carry out the desired programming, i.e., split each of programming levels L0, L2 and L4 in two (FIG. 9). For example, for memory cells that should not be programmed in the second phase, the LSB and MSB values are set to "1".

Consider, for example, a scheme in which the first programming phase programs levels L0, L1, L3 and L5. The second programming phase splits levels L1, L3 and L5 to produce levels L2, L4 and L6, respectively. In this example embodiment, the system may implement the second programming phase by setting the following bit values in the LSB and MSB page buffers:

| Desired programming level | LSB value | MSB value |
|---|---|---|
| L0 (already programmed) | "1" | "1" |
| L1 (already programmed) | "1" | "1" |
| L2 | "1" | "0" |
| L3 (already programmed) | "1" | "1" |
| L4 | "0" | "0" |
| L5 (already programmed) | "1" | "1" |
| L6 | "0" | "1" |

In these embodiments, readout of the LSB and MSB data (which was programmed in the first programming phase) can be carried out using three read thresholds—One for reading the LSB data and two for reading the MSB data. The additional data written in the second programming phase is typically read using additional read thresholds and logical operations on the read bits.

The embodiments of FIG. 9 above referred to a scheme that produces seven programming levels. The disclosed technique, however, can be used for producing other numbers of programming levels that are not an integer power of two. For example, the system may store data at an average density of 2.5 bits/cell using a total of six programming levels. This density is very close to the theoretical upper bound of $\log_2(6)=2.59$ bits/cell.

In such a scheme, the first programming phase stores two pages in four initial programming levels. In the second programming phase, two of these levels are split to produce two additional programming levels. Thus, the second programming phase stores an additional half page. For pre-processing in this scheme, a single inversion bit is sufficient: If the levels that are split during the $2^{nd}$ programming phase have bit mappings (after the $1^{st}$ phase, i.e., after two pages are programmed) having one bit in common, then only this bit needs to be monitored. For example, if the split is applied to levels whose initial mapping is "01" and "00", then it is necessary to monitor only the left-hand-side bit and ensure that more than 50% of the cells will have this bit as "0". If the split is from states "10" and "00", it is necessary to monitor the right-hand-side bit. However, if the split is from "01" and "10" (which have no bit in common), then one inversion bit is not sufficient and two inversion bits are needed.

As yet another example, the system may store data at an average density of 2.25 bits/cell using a total of five programming levels. This density is close to the theoretical upper bound of $\log_2(5)=2.32$ bits/cell. In such a scheme, the first programming phase stores two pages in four initial programming levels. In the second programming phase, one of these levels is split to produce one additional programming level. Thus, the second programming phase stores an additional ¼ page. Pre-processing in this scheme typically uses two single inversion bits.

As still another example, the system may store data at an average density of 3.125 bits/cell using a total of nine programming levels. This density is very close to the theoretical upper bound of $\log_2(9)=3.17$ bits/cell. In such a scheme, the first programming phase stores three pages in eight initial programming levels. In the second programming phase, one of these levels is split to produce one additional programming level. Thus, the second programming phase stores an additional ⅛ page.

In the embodiments of FIGS. 6-9, the system programs a partial subset of the memory cells in the final programming phase, whereas all the preceding phases program all the memory cells in the group. This choice, however, is made purely by way of example. In alternative embodiments, the system may program a partial subset of the memory cells at any of the programming phases, followed by one or more subsequent programming phases that program all the memory cells in the group. Any such scheme can be used for achieving a number of final programming levels that is not an integer power of two.

The programming schemes of FIGS. 6-9 are advantageous, for example, because they enable the system to use Gray mapping of bit value combinations to programming levels (i.e., mapping in which neighboring programming levels differ by only a single bit value). Gray mapping is often difficult or impossible to achieve in known schemes that use a number of programming levels that is not an integer power of two.

ADDITIONAL EMBODIMENTS AND VARIATIONS

FIG. 4 above illustrates an example programming scheme that stores data at a density of 1.5 bits per cell by storing three bits in a pair of memory cells, each memory cell having three possible programming levels. The following description gives an alternative way of storing three bits in a pair of memory cells. This alternative scheme uses four possible programming levels for each memory cell, but permits only a partial subset of the sixteen possible combinations of programming levels in the two cells.

FIG. 10 is a diagram that schematically illustrates a process of storing three data pages in memory cells belonging to two word lines, in accordance with an alternative embodiment of the present invention. In the present example, each of the two memory cells can be programmed to one of four possible programming levels denoted L0 . . . L3. One cell belongs to WL1 and the other belongs to WL2. The left-hand-side of FIG. 10 shows the two memory cells after LSB programming, i.e., after one memory page is stored in each WL. At this stage, each memory cell is programmed to either L0 or L2, according to the bit mapping shown in the figure. The resulting four combinations of programming levels in the two memory cells are marked with constellation points 130.

In this embodiment, an additional bit is then stored jointly in the two memory cells, and this stage is referred to as HMSB programming. In HMSB programming, each programming level in each memory cell is split into two programming levels, depending on the HMSB bit value. The programming levels of the two memory cells after LSB and HMSB programming are shown on the right-hand-side of the figure. The resulting eight combinations of programming levels in the two memory cells are marked with constellation points 134. Note that although each memory cell can be programmed to one of four possible levels (L0 . . . L3), only eight of the sixteen possible combinations of programming levels are used for LSB+HMSB programming. Thus, three bits (and not four) are stored in each pair of memory cells.

Assuming the voltage window (the difference between the highest to lowest threshold voltages) is normalized to unity, the minimal distance between constellation points 134 is $\sqrt{2}/3$. This minimal distance is slightly smaller than the minimal distance of ½ achieved by the scheme of FIG. 4. However, the scheme of FIG. 10 can be generalized to higher dimensions (larger number of memory cells) in a straightforward manner so as to achieve larger minimal distances.

For a group of n cells each having m possible programming levels, there are $m^n$ possible combinations of programming levels per group. The possible combinations can be diluted by a factor of two (i.e., using only half of the combinations) so as to increase the minimal distance by a factor of $\sqrt{2}$. This kind of dilution can be applied recursively (i.e., the constellation can be further diluted by a factor of two to gain another factor of $\sqrt{2}$ in minimal distance, and so on).

The dilution can be performed in any suitable manner. Example dilution schemes are described by Wei, in "Trellis-Coded Modulation with Multidimensional Constellations," IEEE Transactions on Information Theory, volume IT-33, no. 4, July, 1987, pages 483-501, which is incorporated herein by reference. This technique can be used, for example, for mapping five pages to 3 WLs, so as to achieve a storage density of ~1.67 bits/cell, using four possible programming levels per cell. This mapping is achieved by diluting the original $4^5$-point constellation by a factor of four and increasing the minimal distance by a factor of two.

As another example, seven pages can be mapped to four WLs (achieving a storage density of ~1.75 bits/cell) by diluting the original $4^7$-point constellation by a factor of eight and increasing the minimal distance by a factor of $2\sqrt{2}$. As can be seen from these examples, the disclosed technique allows flexibility in choosing storage densities in the range [1.5 2], which may be difficult to achieve using the approach of FIG. 4.

The "level splitting" programming schemes described above focused on splitting programming levels individually for each memory cell in a second programming phase. This approach can be generalized to groups of two or more memory cells, for which the combinations of programming levels are split. Let the term "multi-state" refer to the joint programming level of a group of memory cells, i.e., the combination or vector of programming levels of the memory cells in the group.

In this generalized scheme, a group of memory cells is programmed in a first programming phase to one of several initial multi-states. In a second programming phase, only a partial subset of the initial multi-states are split, to produce additional multi-states that are different from the initial multi-states. The total number of multi-states (initial and additional multi-states) following the second programming phase is typically not an integer power of two. The initial multi-states, the partial subset of the initial multi-states to be split, and the additional multi-states, are defined jointly for the multiple memory cells in the group.

Figure 11:
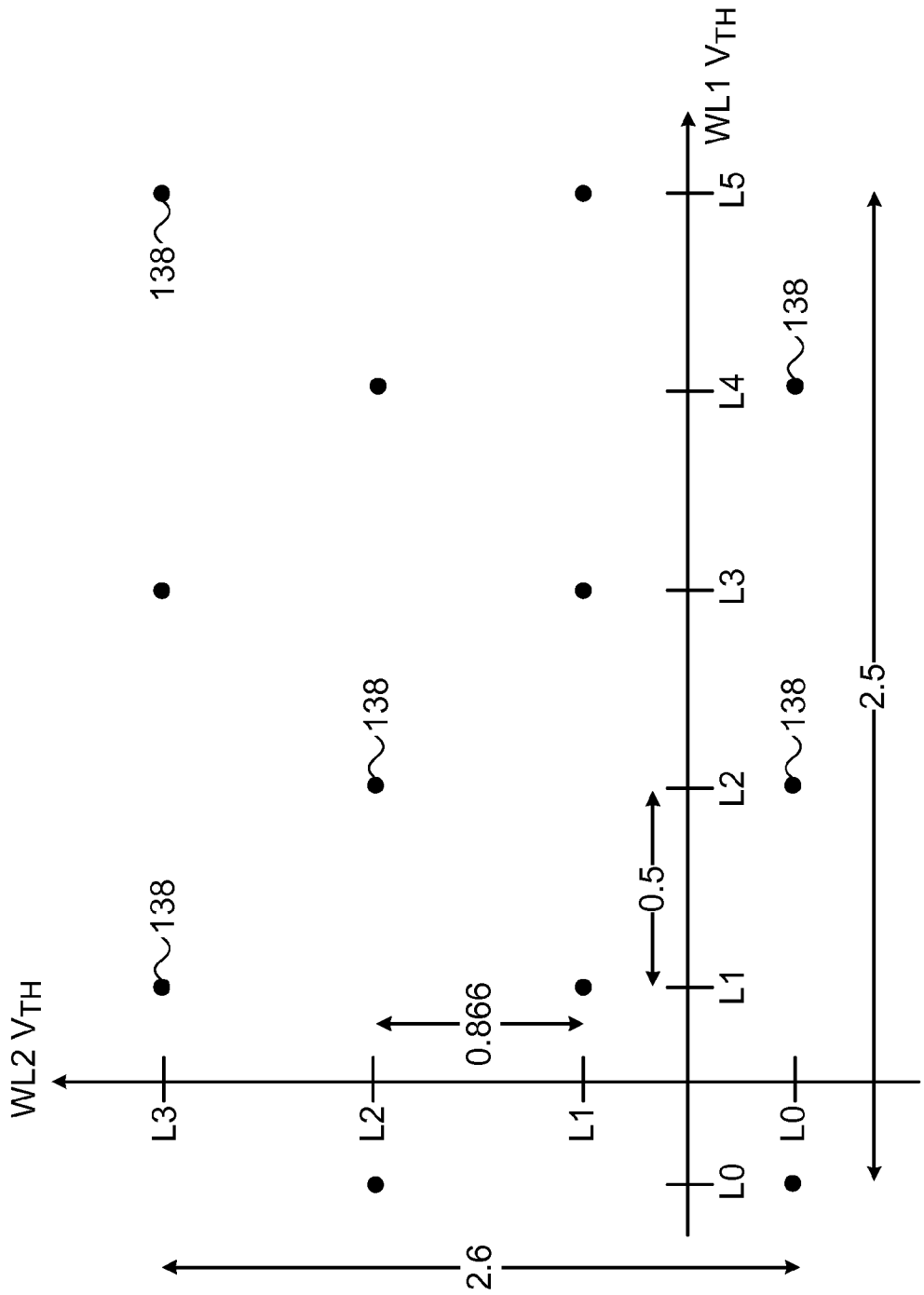
FIG. 11 is a graph showing storage of data using a non-integer number of bits per memory cell, in accordance with another embodiment of the present invention.

FIG. 11 is a graph showing storage of data using a non-integer number of bits per memory cell, in accordance with an embodiment of the present invention. In the present example, a first memory cell in WL1 is programmable to one of six programming levels denoted L0 . . . L5, and a second memory cell in WL2 is programmable to one of four programming levels denoted L0 . . . L3. The same process is applied to the other pairs of memory cells along WL1 and WL2.

In the first programming phase, three bits are stored in each pair of memory cells by programming the pair of cells to eight initial multi-states (some of which may not belong to the final set of multi-states). In the second programming phase, an additional half page is stored in each pair of cells by splitting four of the eight initial multi-states in two. The second programming phase results in a total of twelve final multi-states (out of the twenty four possible combinations of programming levels in the two cells). In the present example, the final multi-states of the pair of memory cells are marked in the figure with constellation points 138. Alternatively, any other suitable multi-state constellation can be used.

Splitting multi-states of multiple cells enables higher flexibility in choosing the desired storage density, in comparison with splitting programming levels of individual cells. In the example of FIG. 11, each pair of memory cells holds 3.5 bits, i.e., a storage density of 1.75 bits/cell. This approach can be extended to higher dimensions (larger groups of memory cells) in a straightforward manner. For a given dimension, the constellation of final multi-states can be chosen, for example, as the constellation that has the highest minimum distance between constellation points, such as an optimal lattice. Lattices of this sort are described, for example, by Conway and Sloane, in "Sphere Packings, Lattices and Groups," Springer, New York, third edition, 1998, chapter 4, pages 94-131, which is incorporated herein by reference. The two-dimensional 12-point constellation of FIG. 11, for example, is derived from a two-dimensional hexagonal lattice that is shown on page 110 of this book. Alternatively, the constellation of final multi-states can be chosen using any other suitable criterion.

Some of the embodiments described herein refer mainly to system 20 or to memory controller 40 as carrying out the disclosed techniques. This choice, however, is made purely by way of example. Alternatively, the disclosed techniques can be carried out by R/W unit in the memory device, or jointly by the memory controller and R/W unit. Any suitable partitioning of functions between the memory controller and the R/W unit can be used.

Although the embodiments described herein mainly address storage applications, the methods and systems described herein can also be used in other applications, such as in communication systems. For example, when using Pulse Amplitude Modulation (PAM) or Quadrature Amplitude Modulation (QAM), the disclosed techniques can be used for mapping bits to symbols in a communication packet or message, for a constellation whose size is not an integer power of two.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
accepting data for storage in an array of memory cells, which are arranged in rows associated with respective word lines;
storing at least a first page of the data in a first row of the array, and at least a second page of the data in a second row of the array, wherein the second row is associated with a different word line from the first row; and
after storing the first and second pages, storing a third page of the data jointly in the first and second rows;
wherein storing the third page includes marking memory cells that suffer from distortion by programming one or more other memory cells with a predetermined programming level, wherein the one or more other memory cells are located in the first row of the array or in the second row of the array.

2. The method according to claim 1, wherein storing the third page comprises selecting respective programming levels at least for one memory cell in the first row and one memory cell in the second row based on a given bit value of the third page.

3. The method according to claim 1, wherein storing the third page comprises storing a given bit of the third page by:
selecting a first programming level for a first memory cell in the first row based on the given bit of the third page and on a corresponding first bit of the first page;
selecting a second programming level for a second memory cell in the second row based on the given bit of the third page and on a corresponding second bit of the second page; and
programming the first and second memory cells to the selected first and second programming levels, respectively.

4. The method according to claim 1, wherein storing the third page comprises storing a given bit of the third page by:
selecting a first programming level for a first memory cell in the first row, and a second programming level for a second memory cell in the second row, based on the given bit of the third page, on a corresponding first bit of the first page and on a corresponding second bit of the second page; and
programming the first and second memory cells to the selected first and second programming levels, respectively.

5. The method according to claim 1, wherein storing the first, second and third pages comprises executing respective, different first, second and third page programming commands.

6. The method according to claim 1, and comprising performing at least one storage operation in a third row, which neighbors the first row or the second row, after storing the first page and before storing the third page.

7. The method according to claim 1, wherein storing the third page comprises programming the memory cells in the first and second row using a number of programming levels that is not an integer power of two.

8. The method according to claim 1, wherein each of the memory cells is programmable to a respective set of programming levels, and wherein storing the third page comprises selecting the programming levels at least for a first memory cell in the first row and a second memory cell in the second row from a partial subset of possible combinations of the programming levels of the first and second memory cells.

9. Apparatus for data storage, comprising:
a memory, which comprises an array of memory cells that are arranged in rows associated with respective word lines; and
storage circuitry, which is configured to accept data for storage in the array, to store at least a first page of the data in a first row of the array, to store at least a second page of the data in a second row of the array, wherein the second row is associated with a different word line from the first row, and, after storing the first and second pages, to store a third page of the data jointly in the first and second rows;
wherein to store the third page of the data, the storage circuitry is further configured to mark memory cells that suffer from distortion by programming one or more memory cells with a predetermined programming level, wherein the one or more other memory cells are located in the first row of the array or in the second row of the array.

10. The apparatus according to claim 9, wherein the storage circuitry is configured to select respective programming levels at least for one memory cell in the first row and one memory cell in the second row based on a given bit value of the third page.

11. The apparatus according to claim 9, wherein the storage circuitry is configured to store a given bit of the third page by:
    selecting a first programming level for a first memory cell in the first row based on the given bit of the third page and on a corresponding first bit of the first page;
    selecting a second programming level for a second memory cell in the second row based on the given bit of the third page and on a corresponding second bit of the second page; and
    programming the first and second memory cells to the selected first and second programming levels, respectively.

12. The apparatus according to claim 9, wherein the storage circuitry is configured to store a given bit of the third page by:
    selecting a first programming level for a first memory cell in the first row, and a second programming level for a second memory cell in the second row, based on the given bit of the third page, on a corresponding first bit of the first page and on a corresponding second bit of the second page; and
    programming the first and second memory cells to the selected first and second programming levels, respectively.

13. The apparatus according to claim 9, wherein the storage circuitry is configured to store the first, second and third pages by executing respective, different first, second and third page programming commands.

14. The apparatus according to claim 9, wherein the storage circuitry is configured to perform at least one storage operation in a third row, which neighbors the first row or the second row, after storing the first page and before storing the third page.

15. The apparatus according to claim 9, wherein the storage circuitry is configured to store the third page by programming the memory cells in the first and second row using a number of programming levels that is not an integer power of two.

16. The apparatus according to claim 9, wherein each of the memory cells is programmable to a respective set of programming levels, and wherein the storage circuitry is configured to store the third page by selecting the programming levels for at least for a first memory cell in the first row and a second memory cell in the second row from a partial subset of possible combinations of the programming levels of the first and second memory cells.

* * * * *